US009748641B2

(12) United States Patent
Miura

(10) Patent No.: US 9,748,641 B2
(45) Date of Patent: Aug. 29, 2017

(54) ANTENNA DEVICE AND METHOD FOR DESIGNING SAME

(71) Applicant: NEC Platforms, Ltd., Kawasaki-shi, Kanagawa (JP)

(72) Inventor: Ken Miura, Kawasaki (JP)

(73) Assignee: NEC PLATFORMS, LTD., Tokyo (JP)

( * ) Notice: Subject to any disclaimer, the term of this patent is extended or adjusted under 35 U.S.C. 154(b) by 47 days.

(21) Appl. No.: 14/767,657

(22) PCT Filed: Feb. 13, 2014

(86) PCT No.: PCT/JP2014/000729
§ 371 (c)(1),
(2) Date: Aug. 13, 2015

(87) PCT Pub. No.: WO2014/129147
PCT Pub. Date: Aug. 28, 2014

(65) Prior Publication Data
US 2015/0380810 A1    Dec. 31, 2015

(30) Foreign Application Priority Data

Feb. 20, 2013  (JP) ................................. 2013-031233

(51) Int. Cl.
*H01Q 1/38*         (2006.01)
*H01Q 7/00*         (2006.01)
(Continued)

(52) U.S. Cl.
CPC .............. *H01Q 1/38* (2013.01); *G06F 17/50* (2013.01); *H01Q 5/10* (2015.01); *H01Q 7/00* (2013.01); *H01Q 9/04* (2013.01)

(58) Field of Classification Search
CPC .. H01Q 1/38; H01Q 5/10; H01Q 7/00; H01Q 9/04
(Continued)

(56) References Cited

U.S. PATENT DOCUMENTS 4,792,809 A    12/1988  Gilbert et al.
8,502,741 B2 *  8/2013  Lin ........................ H01Q 1/243
                                                343/700 MS
(Continued)

FOREIGN PATENT DOCUMENTS

CN    102354790 A    2/2012
CN    102782937 A    11/2012
(Continued)

OTHER PUBLICATIONS

Japanese Office Action for JP Application No. 2015-501318 mailed on Aug. 23, 2016 with English Translation.
(Continued)

*Primary Examiner* — Huedung Mancuso

(57) ABSTRACT

Disclosed is an antenna device or the like having a split ring resonator that adapts to different frequency bands. An antenna device has a laminated structure that is composed by alternating dielectric layers (DL) (35) and conductor layers (CL) and that includes a plurality of structures each comprising: a first split ring (first SR) (31) that is formed in a first conductor layer (first CL) (36A) extending along one surface of a DL (35), surrounds an opening (2) and has a first split (first SP) (51) formed in a circumferential portion along the opening (2); a second split ring (second SR) (32) that is formed in a second conductor layer (second CL) (36B), which extends along the other surface of the DL (35), in such a manner that the second SR (32) is opposed to the first SR (31), the second SR (32) surrounding the opening (2) and having a second split (second SP) (52) formed in a circumferential portion along the opening (2); a plurality of conductor vias (CVs) (3) that are circumferentially formed at intervals, sandwich the first SP (51) and second SP (52) and electrically connect the first SR (31) to the second SR (32); and a feeder line (4) that is formed in a particular one of the CLs and has one end electrically connected to at least one of the CVs (3) and the other end insulated from the particular CL by a clearance (39) formed in the particular CL along the extending direction of the particular CL.

4 Claims, 16 Drawing Sheets

(51) Int. Cl.
*H01Q 5/10* (2015.01)
*G06F 17/50* (2006.01)
*H01Q 9/04* (2006.01)

(58) Field of Classification Search
USPC .................................................. 343/700 MS
See application file for complete search history.

(56) References Cited

U.S. PATENT DOCUMENTS

| | | | |
|---|---|---|---|
| 9,496,616 B2* | 11/2016 | Toyao | ........................ H01Q 7/00 |
| 2010/0065325 A1* | 3/2010 | Lee | ........................ H05K 9/0003 |
| | | | 174/350 |
| 2012/0105295 A1* | 5/2012 | Lin | ........................ H01Q 1/243 |
| | | | 343/841 |
| 2012/0325915 A1 | 12/2012 | Kato et al. | |
| 2014/0203993 A1* | 7/2014 | Toyao | ........................ H01Q 13/10 |
| | | | 343/867 |

FOREIGN PATENT DOCUMENTS

| | | |
|---|---|---|
| JP | H05315828 A | 11/1993 |
| JP | 3633593 B2 | 3/2005 |
| JP | 2006217026 A | 8/2006 |
| JP | 2006526322 A | 11/2006 |
| JP | 4534199 B2 | 9/2010 |
| JP | 2012244608 A | 12/2012 |
| WO | 2013/027824 A1 | 2/2013 |

OTHER PUBLICATIONS

International Search Report for PCT Application No. PCT/JP2014/000729, mailed on Apr. 22, 2014.

English translation of Written opinion for PCT Application No. PCT/JP2014/000729.

Hiroshi Toyao, Dong Yuandan, Tatsuo Ito, "Electrically Small Split-Ring Resonator Antenna", 2011 Nen IEICE Communications Society Conference, The Institute of Electronics, Information and Communication Engineers, Aug. 30, 2011 (Aug. 30, 2011), 133, B-1-133.

Chinese Office Action for CN Application No. 201480009690.5 issued on Nov. 30, 2016 with English Translation.

* cited by examiner

ANTENNA DEVICE AND METHOD FOR DESIGNING SAME

This application is a National Stage Entry of PCT/JP2014/000729 filed on Feb. 13, 2014, which claims priority from Japanese Patent Application 2013-031233 filed on Feb. 20, 2013, the contents of all of which are incorporated herein by reference, in their entirety.

TECHNICAL FIELD

The present invention relates to an antenna device having split ring resonators adapted to different frequency bands, and a method for designing the antenna device.

BACKGROUND ART

Nowadays, in electronic devices such as information terminals provided with a wireless function, an antenna for transmitting and receiving a radio wave is formed on a printed substrate.

NPL 1 discloses a technique, in which a split ring resonator having a substantially C-shape by cutting a part of an annular conductive member is used as such an antenna.

A split ring resonator functioning as an antenna (hereinafter, also called as an "SR resonator") is compact. It is possible to manufacture the split ring resonator by forming a pattern functioning as a resonator on a multilayer printed substrate, for instance. Therefore, it is easy to manufacture a split ring resonator antenna, and the manufacturing cost of the split ring resonator antenna is inexpensive.

Further, PTL 1 discloses a technique for implementing a micro strip antenna which receives multiple frequencies proximate to each other with a compact size and simplified structure.

CITATION LIST

Non Patent Literature

[NPL 1] Study on Small Split Ring Resonator Antenna, Proceedings of the Society Conference of the Institute of Electronics, Information and Communication Engineers, 2011 Communication (1) p. 133, Aug. 30, 2011 by the Institute of Electronics, Information and Communication Engineers, written by Hiroshi Toyao, Dong Yuandan, and Tatsuo Itoh

Patent Literature

[PTL 1] Japanese Laid-open Patent Publication No. 1993 (H5)-315828

SUMMARY OF INVENTION

Technical Problem

Nowadays, the aforementioned electronic devices such as information terminals are provided with a plurality of antennas in order to selectively use a plurality of frequency bands for a variety of communication purposes.

However, NPL 1 fails to disclose how to form a plurality of split ring resonators functioning as antennas using different frequency bands on a printed substrate.

Therefore, when the technique described in NPL 1 is applied to an antenna of an electronic device, how to apply the technique to the antenna is a problem to be solved.

An object of PTL 1 is not receiving signals of a plurality of frequencies by using a plurality of antennas.

An object of the present invention is to provide an antenna device and a method for designing the antenna device that solve the aforementioned problems.

Solution to Problem

An antenna device according to the present invention includes a plurality of structures, each structure including:
  a first split ring portion which is formed in a first conductor layer of a structural member configured such that a dielectric layer and a conductor layer are alternately laminated to each other, the first conductor layer extending on one surface side of the dielectric layer, the first split ring portion surrounding an opening, the first split ring portion including a first split portion formed in a part of a circumferential direction along the opening;
  a second split ring portion which is formed in a second conductor layer extending on the other surface side of the dielectric layer, the second split ring portion surrounding an opening formed to face the first split ring portion, the second split ring portion including a second split portion formed in a part of a circumferential direction along the opening;
  a plurality of conductor vias which are formed away from each other at an interval circumferentially while sandwiching the first split portion and the second split portion, and the plurality of conductor vias electrically connecting the first split ring portion and the second split ring portion; and
  a feeder line which is formed on a specific one of the conductor layers, with one end of the feeder line electrically connected to at least one of the conductor vias, the other end of the feeder line insulated from the specific conductor layer by a clearance formed in the specific conductor layer along an extending direction of the specific conductor layer, wherein
  a first one of the structures constitutes a first split ring resonator antenna which resonates at a first frequency, and
  a second one of the structures constitutes a second split ring resonator antenna which resonates at a second frequency.

As another aspect of the present invention, a method for designing an antenna device comprising,
  adjusting the antenna device of any one of claims 1 to 5 in such a manner that an electrostatic capacitance between counter electrodes of the first split ring resonator antenna is increased, as a length of a side portion of the first split ring resonator antenna where the first split portion and the second split portion are formed, and a length of a side of the first split ring resonator antenna facing the side are shortened so as to approximate a value of reflectance representing a ratio of output power with respect to input power of a signal of a second frequency to be input to the first split ring resonator antenna to zero when the input signal of the second frequency is reflected on the first split ring resonator antenna.

Advantageous Effects of Invention

The present invention provides the following advantageous effects even when split ring resonator antennas adapted to different frequency bands are disposed in proximity to each other. Specifically, the present invention is advantageous in reducing leakage of a signal from a split ring resonator antenna which resonates at a higher frequency band to a spilt ring resonator antenna which resonates at a lower frequency band.

DESCRIPTION OF EMBODIMENTS

Figure 1:
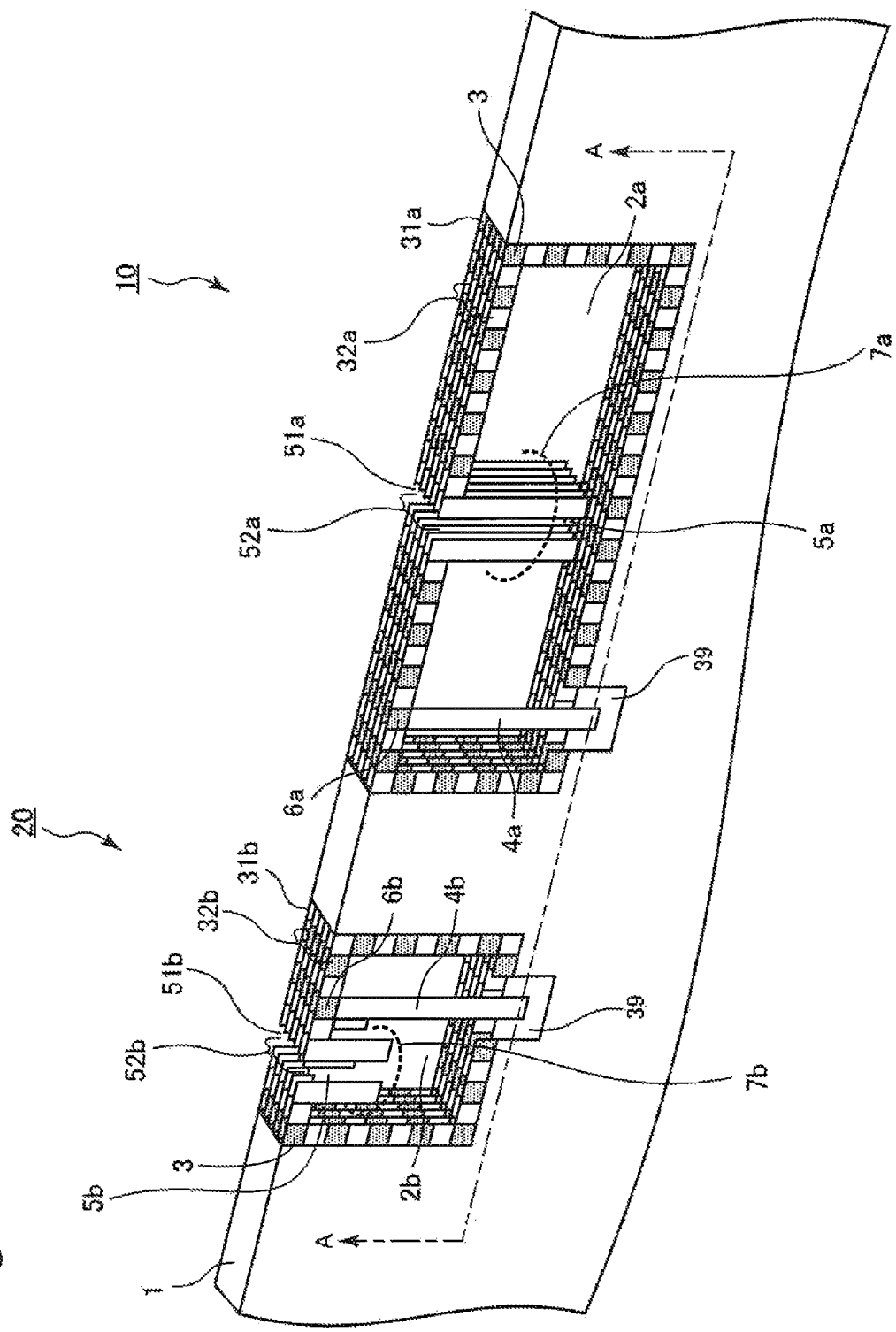
FIG. 1 is a perspective view schematically illustrating an antenna device according to a first exemplary embodiment of the present invention.

Exemplary embodiments of the present invention are described in detail referring to the drawings.

First Exemplary Embodiment

FIG. 1 is a perspective view schematically illustrating an antenna device according to a first exemplary embodiment of the present invention.

Referring to FIG. 1, the antenna device in the exemplary embodiment includes a conductive substrate 1 configured such that dielectric layers (not illustrated in FIG. 1) and conductor layers (not illustrated in FIG. 1) are laminated to each other, a 2.4 GHz-band split ring resonator antenna 10, and a 5 GHz-band split ring resonator antenna 20 that are formed on the conductive substrate 1. Hereinafter, the 2.4 GHz-band split ring resonator antenna 10, and the 5 GHz-band split ring resonator antenna 20 are also respectively abbreviated as an "SR resonator antenna 10" and an "SR resonator antenna 20".

The 2.4 GHz-band SR resonator antenna 10 includes an opening 2a, conductor vias 3, a feeder line 4a, and a split portion 5a.

The 5 GHz-band SR resonator antenna 20 includes an opening 2b, conductor vias 3, a feeder line 4b, and a split portion 5b.

The SR resonator antennas 10 and 20 are respectively formed with a conductor layer having a substantially C-shape (or a C-shape (hereinafter, the same description is applied.)) in the periphery of the openings 2a and 2b in this order. Specifically, the conductor layer having a substantially C-shape has a structure such that the portions indicated as the split portions 5a and 5b are respectively cut away in this order. The conductor layer having a substantially C-shape is respectively formed as a first split ring portion 31 and a second split ring portion 32 to be described later. The first split ring portion 31 and the second spilt ring portion 32 are disposed so as to overlap each other. In the following description, the openings 2a and 2b may be generically called as an "opening 2".

Figure 4:
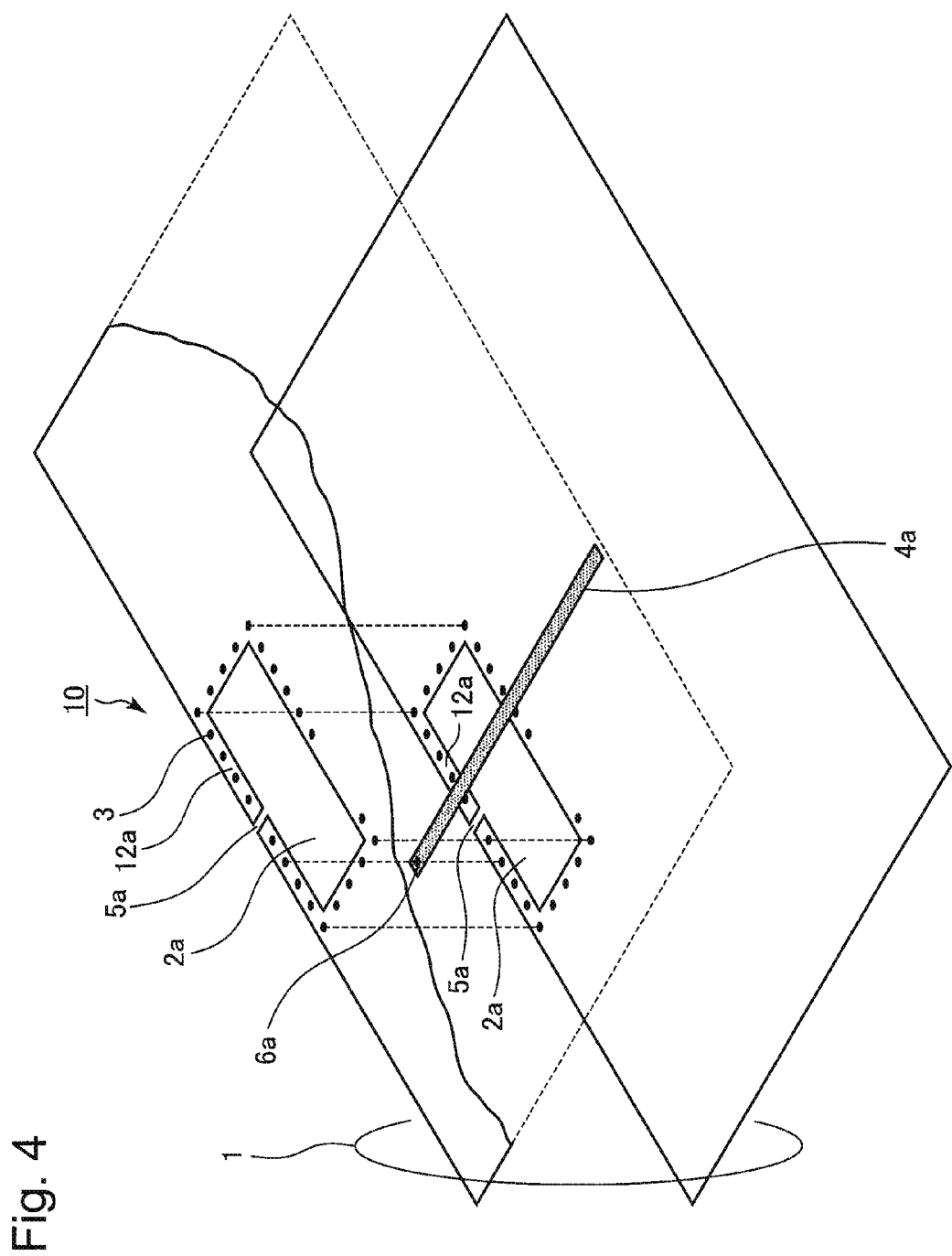
FIG. 4 is a perspective view of another antenna device according to the first exemplary embodiment.

Further, the SR resonator antennas 10 and 20 are respectively formed on the conductive substrate 1 in this order in such a manner that the side portions of the SR resonator antennas 10 and 20 where the split portions 5a and 5b are formed are exposed on one end surface of the conductive substrate 1. In the following description, the split portions 5a and 5b may be generically called as a "split portion 5". The conductor vias 3 are schematically illustrated as gray squares in FIG. 1. Specifically, as illustrated in FIG. 4, each concrete structure of the conductor vias 3 is a cylindrical through-hole, for instance. Portions, which are schematically illustrated as white squares adjacent to the conductor vias 3 in a circumferential direction of the opening 2, represent the conductive substrate 1. FIG. 4 is a perspective view of another antenna device according to the first exemplary embodiment.

Figure 2:
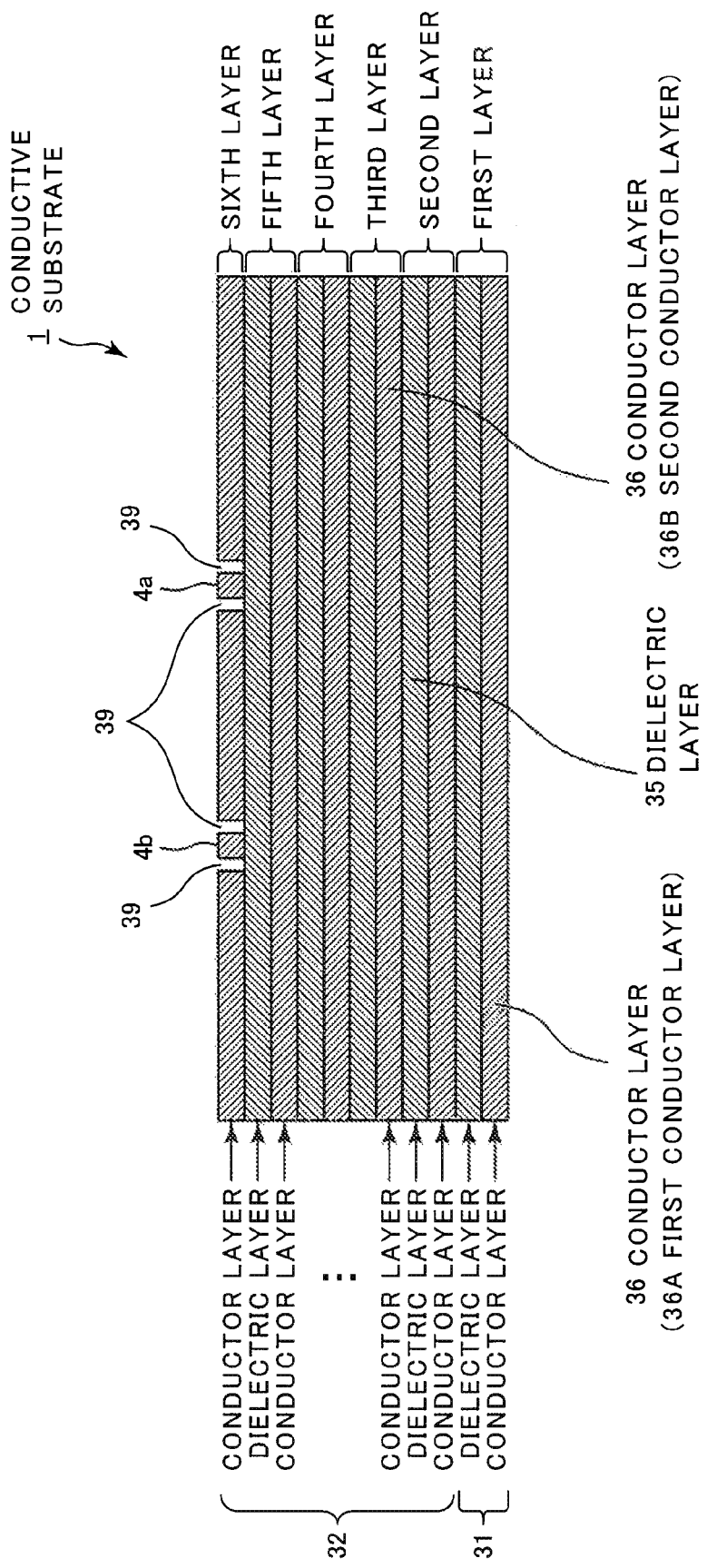
FIG. 2 is a sectional view of the antenna device taken along the line A-A illustrated in FIG. 1.

The structure of the conductive substrate 1 is described. FIG. 2 is a sectional view of the antenna device taken along the line A-A illustrated in FIG. 1.

As illustrated in FIG. 2, the conductive substrate 1 includes a plurality of layers configured such that dielectric layers 35 and conductor layers 36 are alternately laminated to each other. In the exemplary embodiment, the conductive substrate 1 includes a dielectric layer 35 and a conductor layer 36 in each of the first layer to fifth layer in one instance. The sixth layer extending along the fifth layer includes only a conductor layer 36.

To simplify the description, the conductor layer 36 including the first layer serving as the outermost surface of the conductive substrate 1 is also called as a first conductor layer 36A. In the SR resonator antennas 10 and 20 illustrated in FIG. 1, a first split ring portion 31a and a first split ring portion 31b of a substantially C-shape are respectively formed in this order in the first layer constituted of the first conductor layer 36A and a dielectric layer 35. In the following description, the first split ring portions 31a and 31b may be generically called as a "first split ring portion 31".

As illustrated in FIG. 2, the second to fifth layers have a structure (a structural member) such that a second conductor layer 36B and a dielectric layer 35 are alternately laminated to each other. The sixth layer is constituted of a first conductor layer. A second split ring portion 32a and a second split ring portion 32b having a substantially C-shape, which are not illustrated in FIG. 2, are formed in each of the second to fifth layers, and the sixth layer. Specifically, in the schematic structure diagram illustrated in FIG. 1, illustration of dielectric layers formed between the layers illustrated in FIG. 2 is omitted. In the following description, the second split ring portions 32a and 32b may be generically called as a "second split ring portion 32".

In the exemplary embodiment, description is made based on the premise that the second split ring portion 32 has the second to sixth layers, namely, five layers in total.

The number of layers of the antenna device of the present invention as described by the exemplary embodiment for instance, however, is not limited to five.

Further, the sixth layer is a layer such that a conductor layer 36 constitutes a part of the second split ring portion 32, and on which the feeder line 4a and the feeder line 4b to be described later are provided (drawn). In the following description, the feeder lines 4a and 4b may be generically called as a "feeder line 4".

The openings 2a and 2b illustrated in FIG. 1 are in a state such that the openings are schematically formed solely by the conductor layers 36 because the illustration of the actually existing dielectric layers 35 is omitted to simplify the description. In other words, there is no physical opening that passes through the antenna device in the exemplary embodiment.

The configuration of each of the SR resonator antennas 10 and 20 is further described referring to FIG. 1 and FIG. 2.

The 2.4 GHz-band SR resonator antenna 10 is provided with the first split ring portion 31a and the second split ring portion 32a which overlap each other (FIG. 1).

The split portion 5a is a clearance formed by cutting away the 2.4 GHz-band SR resonator antenna 10 at a position of the opening 2a. The split portion 5a is constituted of a first split portion 51a corresponding to the first layer, and a second split portion 52a corresponding to the second to sixth layers.

In other words, the first split ring portion 31a and the second split ring portion 32a are respectively formed to surround the opening 2a in a cutaway state as illustrated by the first split portion 51a and the second split portion 52a in FIG. 1. The first split ring portion 31a and the second split ring portion 32a have a structure such that the first layer and the second to sixth layers are laminated to each other.

The 5 GHz-band SR resonator antenna 20 has substantially the same structure as the 2.4 GHz-band SR resonator antenna 10. Specifically, the 5 GHz-band SR resonator antenna 20 is provided such that the first split ring portion 31b and the second split ring portion 32b overlap each other (FIG. 1).

The split portion 5b is a clearance formed by cutting away the 5 GHz-band SR resonator antenna 20 at a position of the opening 2b. The split portion 5b is constituted of a first split portion 51b corresponding to the first layer, and a second split portion 52b corresponding to the second to sixth layers.

Specifically, the first split ring portion 31b and the second split ring portion 32b are respectively formed to surround the opening 2b in a cutaway state as illustrated by the first split portion 51b and the second split portion 52b in FIG. 1. The first split ring portion 31b and the second split ring portion 32b have a structure such that the first layer and the second to sixth layers are laminated to each other.

In the SR resonator antennas 10 and 20, the first split portions 51a and 51b are respectively and generically called as a first split portion 51. Further, in the SR resonator antennas 10 and 20, the second split portions 52a and 52b are respectively and generically called as a second split portion 52.

The 2.4-GHz band SR resonator antenna 10 is called as a first split ring resonator antenna 10 which resonates at a first frequency i.e. a frequency in 2.4 GHz band. The 5-GHz band SR resonator antenna 20 is called as a second spilt ring resonator antenna 20 which resonates at a second frequency i.e. a frequency in 5 GHz band.

Specifically, the antenna device in the exemplary embodiment is a structural member configured such that the dielectric layers 35 and conductor layers are alternately laminated to each other.

The antenna device includes the first split ring portion 31, which is formed in the first conductor layer 36A extending on one surface side of the dielectric layer 35, which surrounds the opening 2, and which includes the first split portion 51 formed in a part of the circumferential direction along the opening 2.

The antenna device includes the second split ring portion 32, which is formed in the second conductor layer 36B extending on the other surface side of the dielectric layer 35, which surrounds the opening 2 formed to face the first split ring portion 31, and which includes the second split portion 52 formed in a part of the circumferential direction along the opening 2.

The antenna device includes a plurality of the conductor vias 3 which are formed to be away from each other at an interval circumferentially while sandwiching the first split portion 51 and the second split portion 52 for electrically connecting the first split ring portion 31 and the second split ring portion 32.

The antenna device includes the feeder line 4, which is formed on a specific one of the conductor layers, with one end thereof electrically connected to at least one of the conductor vias 3, and the other end thereof insulated from the specific conductor layer via a clearance 39 formed in the specific conductor layer along an extending direction of the specific conductor layer.

The antenna device in the exemplary embodiment has a plurality of the aforementioned structures, wherein the first one of the structures constitutes the first split ring resonator antenna 10 which resonates at the first frequency, and the second one of the structures constitutes the second split ring resonator antenna 20 which resonates at the second frequency.

The antenna device in the exemplary embodiment includes the first split ring resonator antenna 10 which is provided with the aforementioned constituent elements and resonates at the first frequency, and the second split ring resonator antenna 20 which is provided with the aforementioned constituent elements and resonates at the second frequency.

The conductor vias 3 are conductive members which are formed to be away from each other at a predetermined interval so as to surround the opening 2 for electrically connecting the conductor layers 36 of the first to sixth layers of the conductive substrate 1, and a feeding point 6 to be described later.

The predetermined interval at which the conductor vias 3 are formed is e.g. 1 mm (millimeter). However, the interval between the conductor vias 3 is not limited to 1 mm.

One end of the feeder line 4a and one end of the feeder line 4b are respectively connected in this order to unillustrated wireless units (high-frequency circuits) of 2.4 GHz band and of 5 GHz band.

The other end of the feeder line 4a and the other end of the feeder line 4b are respectively connected in this order to a feeding point 6a and to a feeding point 6b (hereinafter, also generically called as a "feeding point 6") of the SR resonator antennas 10 and 20 for supplying and receiving high-frequency current to and from the wireless units of the respective frequency bands.

For instance, the feeder line 4 of the sixth layer and another conductor layer 36 are electrically connected to each other via at least one of the conductor vias 3 at the feeding point 6.

It is assumed that the feeder line 4 has, for instance, a rectangular conductive pattern in a cross-section perpendicular to the length direction of the feeder line 4, so that impedance matching with an input and output port of the wireless unit is considered.

A clearance is formed around the feeder lines 4a and 4b so that the feeder lines 4a and 4b are not short-circuited to the conductor layers 36 around the feeder lines 4a and 4b when the feeder lines 4a and 4b are connected to the respective wireless units. The clearance 39 is set to 0.5 mm, for instance. However, the clearance 39 to be formed around the feeder line 4 is not limited to 0.5 mm.

In the foregoing description, the feeder line 4 is drawn from the sixth layer of the second split ring portion 32 illustrated in FIG. 2, in one instance. However, the method for drawing the feeder line 4 is not limited to the aforementioned method. For instance, it is possible to draw the feeder line 4 from the conductor layer 36 (namely, from the first conductor layer 36A) on the outermost surface (the first layer) of the first split ring portion 31.

As illustrated in FIG. 4, the feeder line 4 may be formed and drawn, using the conductor layer 36 in at least one of the inner layers (namely, one of the second to fifth layers) in the second split ring portion 32.

FIG. 4 is a perspective view of another antenna device in the first exemplary embodiment. To simplify the description, in FIG. 4, the 2.4 GHz-band SR resonator antenna 10 formed on the conductive substrate 1 is simply illustrated as a conductor layer on which a split ring portion 12a and the feeder line 4a are formed. Therefore, in FIG. 4, illustration of the dielectric layers and the 5 GHz-band SR resonator antenna 20 is omitted.

In the SR resonator antennas 10 and 20 illustrated in FIG. 1, the layers from which the feeder line 4 is drawn may be different from each other.

The material of the conductor layers 36 constituting a part of the conductive substrate 1 illustrated in FIG. 1 includes, for instance, a conductive metal pattern such as a copper film pattern.

The material of the dielectric layers 35 constituting a part of the conductive substrate 1 illustrated in FIG. 1 is, for instance, a glass epoxy substrate for use in a printed substrate. However, the material of the dielectric layers 35 is not limited to the above, but may be a ceramic substrate or the like.

Next, structures of the 2.4 GHz-band SR resonator antenna 10 and the 5 GHz-band SR resonator antenna 20, which are respectively configured to resonate at a frequency in 2.4 GHz band and at a frequency in 5 GHz band in this order, are described.

The SR resonator antennas 10 and 20 respectively resonate in the aforementioned frequency bands by the length of the conductive members surrounding the outer periphery of the respective openings 2, and by the electrostatic capacitance between counter electrodes 7 sandwiching the split portion 5, which will be described later.

The SR resonator antennas 10 and 20 respectively include counter electrodes 7a and 7b facing each other (making pairs), which are formed at a right angle on the split portions 5a and 5b while extending from the opening end of the split portion 5a and from the opening end of the split portion 5b toward the opening 2. Hereinafter, the "counter electrodes 7a" and the "counter electrodes 7b" are also generically called as "counter electrodes 7". The counter electrodes 7 are provided to obtain an electrostatic capacitance C in the spilt portions 5a and 5b.

Specifically, the electrostatic capacitance C is obtained based on the following well-known equation, assuming that S is a total area of the surfaces of the conductor layers 36 facing each other and constituting the counter electrodes 7 sandwiching the split portion 5, d is a distance between the counter electrodes 7, and E is a permittivity of the gap between the counter electrodes 7.

$$C = \in \times S/d \qquad (\text{Eq. 1})$$

As described above, the area S is of the surfaces of the conductor layers 36 facing each other while sandwiching the split portion 5, and constituting the counter electrodes 7 of each of the antennas. The area S is a product of the sum of thicknesses (heights) of the conductor layers 36, and the length of the counter electrodes 7 which are formed at a right angle while extending from the opening end of the split portion 5 toward the opening 2. In this example, the electrostatic capacitance between the conductor layers 36 of different layers in the counter electrodes 7 is negligibly small, as compared with the electrostatic capacitance between the conductor layers 36 of the same layers facing each other while sandwiching the split portion 5.

The sum of the heights of the conductor layers of the counter electrodes 7 is, for instance, 0.8 mm when the conductor layers are six layers in total. Further, the lengths of the counter electrodes 7 of the SR resonator antennas 10 and 20 are respectively 3.5 mm and 2.5 mm in this order, for instance. However, the aforementioned sizes are merely an example and the present invention is not limited to the aforementioned sizes.

The number of the conductor layers 36 constituting the counter electrodes 7 sandwiching the split portion 5 of each of the antennas is not limited to six, but may be any other number, as far as it is possible to obtain a predetermined electrostatic capacitance between the counter electrodes 7.

In the exemplary embodiment, as illustrated in FIG. 1, the 2.4 GHz-band SR resonator antenna 10 includes the conductor layers 36 constituting the counter electrodes in all the six layers in one instance. On the other hand, the 5 GHz-band SR resonator antenna 20 includes, for instance, the conductor layers 36 formed only on the first layer and the sixth layer, and counter electrodes are not formed on the conductor layers other than the above.

In other words, forming the conductor layer 36 constituting the counter electrodes 7 of each of the antennas by two or more layers makes it possible to obtain a combined electrostatic capacitance such that the electrostatic capacitances between the counter electrodes of each of the conductor layers 36 are connected in parallel. According to the exemplary embodiment, it is possible to adjust the electrostatic capacitance by the number of the conductor layers 36 constituting the counter electrodes 7.

In the exemplary embodiment, the conductor vias 3 for electrically connecting between the conductor layers 36 are formed only at the feeding point 6 with respect to the counter electrodes 7 sandwiching the split portion 5 in one instance. However, the conductor vias 3 may be formed as necessary with respect to the counter electrodes 7 sandwiching the split portion 5.

The 2.4 GHz-band SR resonator antenna 10 and the 5 GHz-band SR resonator antenna 20 respectively resonate at a frequency f in 2.4 GHz band and at a frequency f in 5 GHz band in this order, based on the following well-known equation, assuming that C is an electrostatic capacitance between the counter electrodes 7 as described above, and L is an inductive reactance. The inductive reactance L is an impedance given by the line length, which is the length of the conductive members of the conductor layers 36 surrounding the outer periphery of the opening 2. The electrostatic capacitance C is also called as a "capacitive reactance" in the following description.

$$f=1/(2\pi\sqrt{(LC)})$$ (Eq. 2)

When it is intended to reduce the size of the SR resonator antenna, the line length i.e. the length of the conductive members surrounding the outer periphery of the opening 2, which serves as the inductive reactance L, is shortened. However, it is necessary to fix the resonance frequency f in the aforementioned target frequency band. Therefore, it is necessary to increase the capacitive reactance C between the counter electrodes 7 by using Eq. 2.

It is possible to increase the capacitive reactance C between the counter electrodes 7 by the following methods a) to c), using Eq. 1. For instance, a) The total area S of the surfaces of the conductor layers 36 facing each other and constituting the counter electrodes 7 is increased by increasing the length of the counter electrodes 7.

b) The distance (gap) d between the counter electrodes 7 is shortened.

c) The number of the conductor layers 36 constituting the counter electrodes 7 is increased.

Using one of the aforementioned methods a) to c), or combining at least two of the aforementioned methods a) to c) makes it possible to increase the capacitive reactance C in the SR resonator antennas 10 and 20 according to the exemplary embodiment.

It is also possible to adjust the capacitive reactance C by the thickness (height) of the conductor layer 36, in addition to the aforementioned parameters, as expressed in Eq. 1. Further, π in Eq. 2 is the circular constant.

Figure 3:
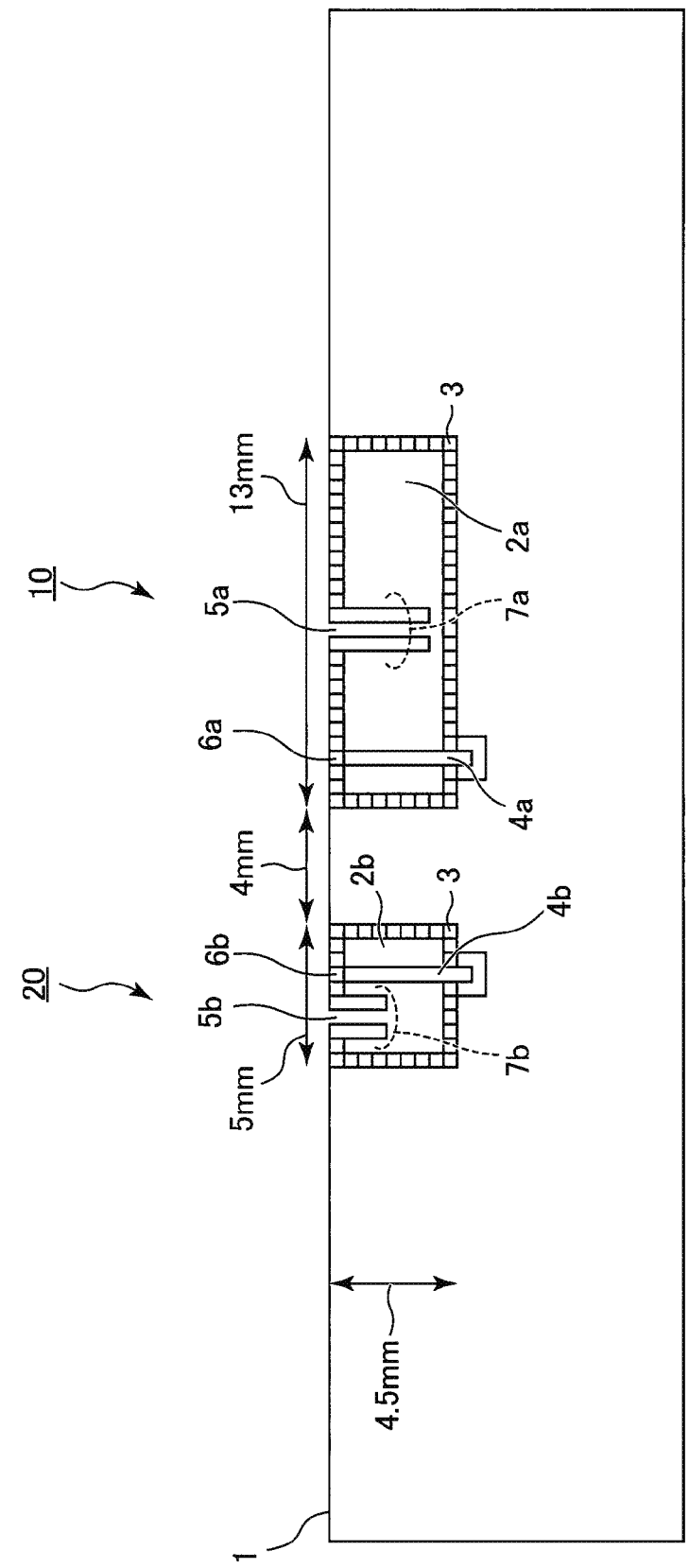
FIG. 3 is a dimensional diagram of the antenna device according to the first exemplary embodiment.

The size of the antenna device provided with the SR resonator antennas 10 and 20 is described using the drawings. FIG. 3 is a dimensional diagram of the antenna device according to the first exemplary embodiment.

Referring to FIG. 3, the length of the side of the 2.4 GHz-band SR resonator antenna 10 where the split portion 5 is formed is e.g. 13 mm, and the length of the side of the 5 GHz-band SR resonator antenna 20 where the split portion 5 is formed is e.g. 5 mm.

The depthwise length of each of the SR resonator antennas 10 and 20 from the end surface where the split portion 5 is formed to the opening 2 is e.g. 4.5 mm.

The distance between the two SR resonator antennas is e.g. 4 mm.

The unillustrated length (thickness) of the conductive substrate 1 in the thickness direction thereof depends on the number of layers of the conductive substrate 1. The thickness of the conductive substrate 1 is e.g. 1.6 mm.

The dimensions described using FIG. 3 are merely an example for describing the exemplary embodiment. The present invention is not limited to the dimensions.

The SR resonator antennas 10 and 20 are designed such that the SR resonator antennas 10 and 20 resonate at the respective resonance frequencies, independently of each other.

The positional relationship between the two SR resonator antennas 10 and 20 may be set such that the positions of the 2.4 GHz-band SR resonator antenna 10 and the 5 GHz-band SR resonator antenna 20 are respectively interchanged on left and right sides as illustrated in FIG. 1. Specifically, it is adoptable to interchange the positions of the feeder line 4a and the split portion 5a of the 2.4 GHz-band SR resonator antenna 10, and the positions of the feeder line 4b and the split portion 5b of the 5 GHz-band SR resonator antenna 20.

The exemplary embodiment is not limited to the SR resonator antenna having the aforementioned shape. As far as it is possible to configure an SR resonator, the SR resonator may have any shape other than the above.

The exemplary embodiment is advantageous in implementing an antenna device incorporated with split ring resonators, using a laminated printed substrate.

Second Exemplary Embodiment

A second exemplary embodiment on the basis of the first exemplary embodiment is described referring to FIG. 5A to FIG. 11.

In the second exemplary embodiment, a method for designing an antenna device applying the 2.4 GHz-band SR resonator antenna 10 and the 5 GHz-band SR resonator antenna 20 according to the first exemplary embodiment is described.

In the exemplary embodiment, there is provided a method for adjusting the characteristics of one of the SR resonator antennas for improvement of the characteristics while miniaturizing the antennas when the SR resonator antennas are disposed in proximity to each other.

FIG. 5A and FIG. 5B, and FIG. 6A and FIG. 6B are diagrams respectively illustrating the antenna performances of the 2.4 GHz-band SR resonator antenna 10 and the 5 GHz-band SR resonator antenna 20 as individual antennas in this order.

Figure 5A:
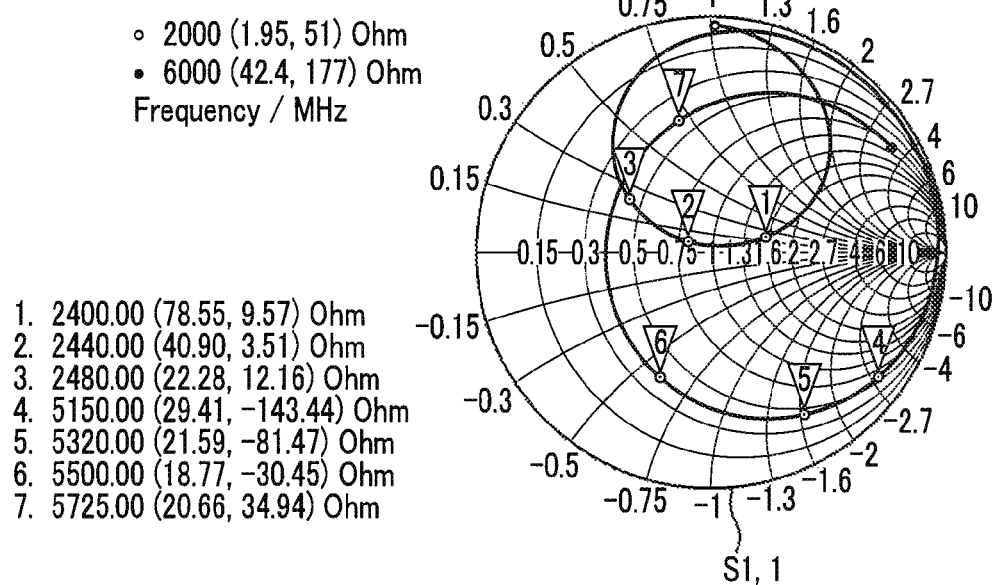
FIG. 5A is a diagram illustrating impedance characteristics of a 2.4 GHz-band split ring resonator antenna according to a second exemplary embodiment.
Figure 5B:
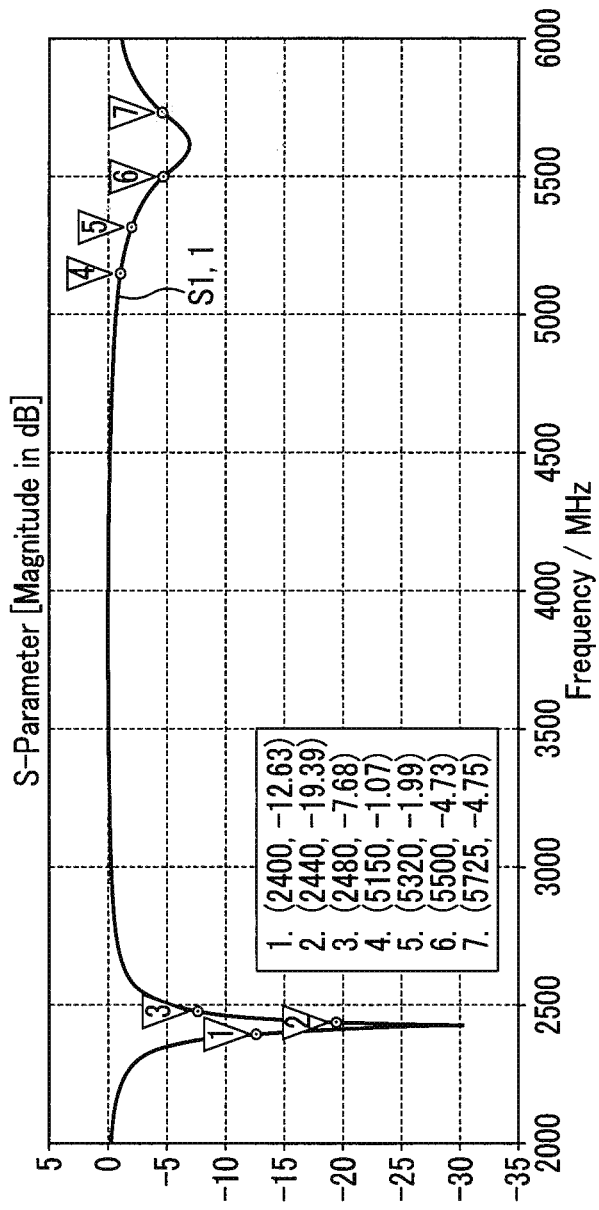
FIG. 5B is a diagram illustrating reflection characteristics of the 2.4 GHz-band split ring resonator antenna according to the second exemplary embodiment.

FIG. 5A is a diagram illustrating impedance characteristics of the 2.4 GHz-band SR resonator antenna 10 according to the second exemplary embodiment. FIG. 5B is a diagram illustrating reflection characteristics of the 2.4 GHz-band SR resonator antenna 10 according to the second exemplary embodiment.

Figure 6A:
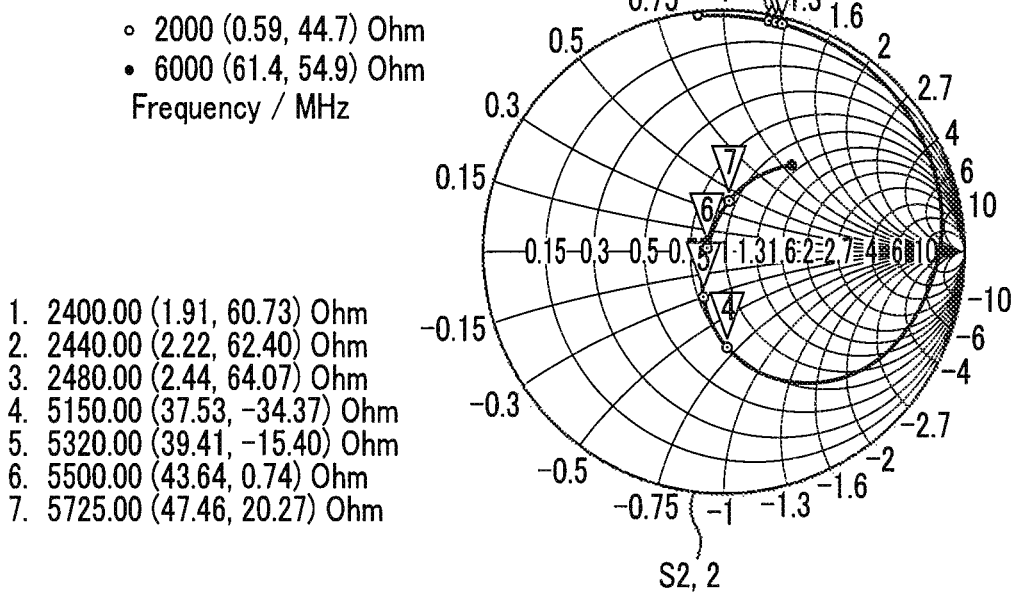
FIG. 6A is a diagram illustrating impedance characteristics of a 5 GHz-band split ring resonator antenna according to the second exemplary embodiment.
Figure 6B:
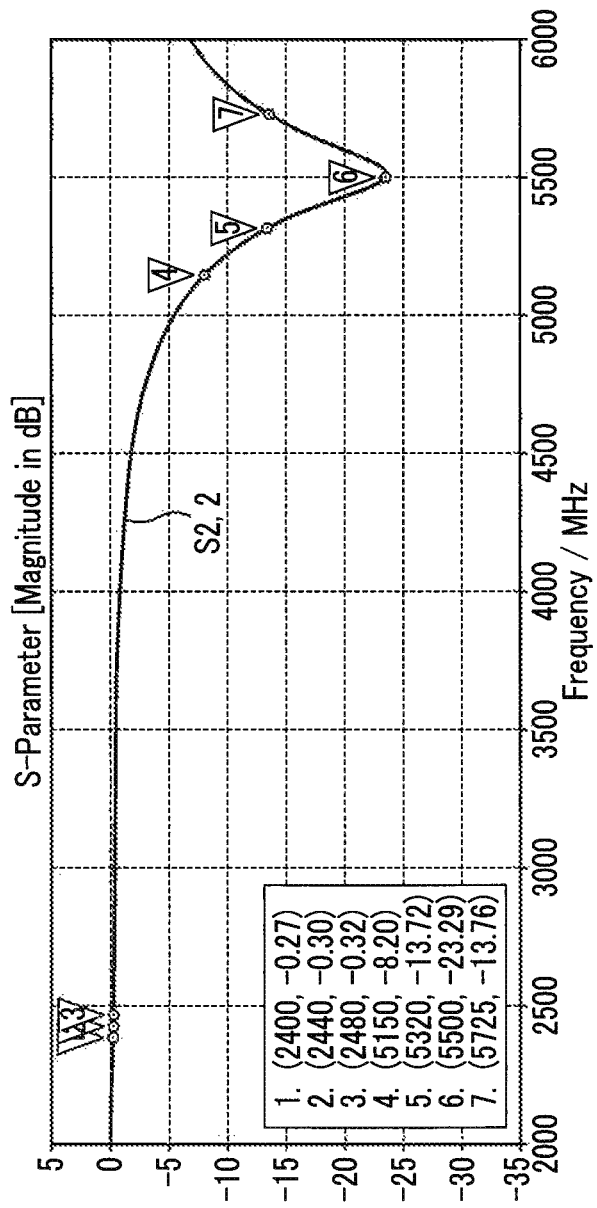
FIG. 6B is a diagram illustrating reflection characteristics of the 5 GHz-band split ring resonator antenna according to the second exemplary embodiment.

FIG. 6A is a diagram illustrating impedance characteristics of the 5 GHz-band SR resonator antenna 20 according to the second exemplary embodiment. FIG. 6B is a diagram illustrating reflection characteristics of the 5 GHz-band SR resonator antenna 20 according to the second exemplary embodiment.

The impedance characteristics represent impedances (a real part and an imaginary part of impedance characteristics) of each of the SR resonator antennas 10 and 20. Specifically, the horizontal axis (a horizontal line) of the circle illustrated in FIG. 5A and FIG. 6A represents a net resistance (a real part of impedance characteristics) of each of the SR resonator antennas 10 and 20. The center point of the horizontal line represents 1, which is a numerical value normalized by 50Ω. The left end of the horizontal line represents 0Ω (namely, a short-circuited state) and the right end of the horizontal line represents ∞ (infinite), Ω (namely, an open state), on the basis of assuming that the center point of the horizontal line has the numerical value 1.

The line (an arc) perpendicularly intersecting with the horizontal line representing a real part represents an imaginary part (a reactance component). The impedance characteristics of the SR resonator antenna are expressed in the upper semicircular portion of the circle with respect to the horizontal line in the following case, on the basis of assuming that the center point has the numerical value 1. Specifically, in this case, for instance, an inductive reactance component as illustrated by a line pattern of the split ring portions 31 and 32 is imparted to the SR resonator antenna in series.

On the other hand, impedance characteristics of the SR resonator antenna are expressed in the lower semicircular portion of the circle with respect to the horizontal line in the following case, on the basis of assuming that the center point has the numerical value 1. Specifically, in this case, for instance, a capacitive reactance component between the counter electrodes 7 sandwiching the split portion 5 is imparted to the SR resonator antenna in series.

The indication 2000 (1.95, 51) Ohm (Ω) with the white dot in the upper left portion of FIG. 5A is read as follows. The first numerical value represents a value of frequency, and the numerical values in the bracket respectively represent in this order a value of a real part and a value of an imaginary part of impedance characteristics at the value of frequency with a comma between the values. In other words, the value of the real part of impedance characteristics is 1.95Ω, and the value of the imaginary part of impedance characteristics is 51Ω when the frequency is 2 GHz. Specifically, the indication "Frequency/MHz" in FIG. 5A represents that the unit of frequency is megahertz. Further, the point indicated with the solid dot in the upper left portion of FIG. 5A represents numerical values of impedance characteristics at 6000 MHz (6 GHz). Further, regarding the frequencies described in items 1 to 7 in the lower left portion of FIG. 5A, the frequencies described in items 1 to 3 respectively represent numerical values of impedance characteristics when the frequency is in 2.4 GHz band. Further, the frequencies described in items 4 to 7 respectively represent numerical values of impedance characteristics when the frequency is in 5 GHz band. The reading regarding FIG. 5A as described above is also applied to FIG. 6A and FIG. 10A.

Specifically, impedance characteristics of the 2.4 GHz-band SR resonator antenna 10 illustrated in FIG. 5A, and impedance characteristics of the 5 GHz-band SR resonator antenna 20 illustrated in FIG. 6A satisfy the impedance characteristics in the respective frequency bands. More specifically, in FIG. 5A, a reactance component in the vicinity of the center frequency of 2.4 GHz band is present in the vicinity of the numerical value 1 representing the center point. Likewise, in FIG. 6A, a reactance component in the vicinity of the center frequency of 5 GHz band is present in the vicinity of the numerical value 1 representing the center point.

Further, reflection characteristics illustrated in FIG. 5B and FIG. 6B respectively represent ratios to be obtained when signals respectively input from the feeder line 4 of the SR resonator antennas 10 and 20 are respectively reflected on the antennas, and the reflected signals return to the feeder line 4.

Reflection characteristics are such that the horizontal axis represents a frequency, and the vertical axis represents a ratio of output (reflection) power with respect to input power in the unit of dB (decibel). The horizontal axis representing a frequency in FIG. 5B and FIG. 6B is such that the frequency is increased toward the right direction, and the vertical axis representing a reflectance is such that the reflectance is reduced toward the lower direction at the frequency (in other words, a radio wave is efficiently radiated).

The reflection characteristics of the 2.4 GHz-band SR resonator antenna 10 illustrated in FIG. 5B, and the reflection characteristics of the 5 GHz-band SR resonator antenna 20 illustrated in FIG. 6B represent that the reflection characteristics in the respective frequency bands are satisfied. Specifically, in FIG. 5B, reflection in the vicinity of the center frequency of 2.4 GHz band is reduced. Further, in FIG. 6B, reflection in the vicinity of the center frequency of 5 GHz band is reduced.

However, the ratio of reflection (a return loss value) at a frequency in 5 GHz band, which is not 2.4 GHz-band that is the center frequency of the 2.4 GHz-band SR resonator antenna 10 illustrated in FIG. 5B, is about −7 dB as a smallest value.

In other words, the 2.4 GHz-band SR resonator antenna 10 has characteristics such that an input signal may be radiated (leak) even at a frequency in 5 GHz band, which is a frequency in a frequency band other than 2.4 GHz band, as a target frequency.

The fact that the 2.4 GHz-band SR resonator antenna 10 has characteristics such that a signal may be radiated even at a frequency in 5 GHz band means that the 2.4 GHz-band SR resonator antenna 10 is likely to receive a signal of a frequency in 5 GHz band.

It is impossible to secure isolation characteristics to be described later using FIG. 7 between the 2.4 GHz-band SR resonator antenna 10 and the 5 GHz-band SR resonator antenna 20, which are disposed in proximity to each other.

Figure 7:
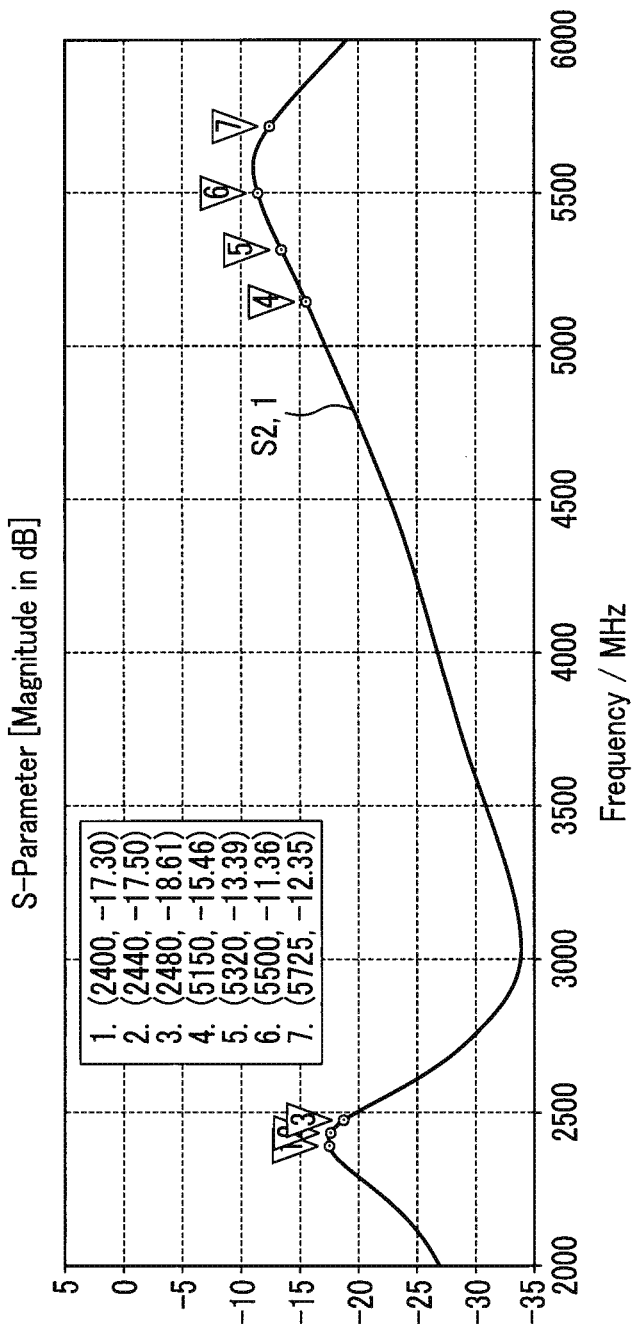
FIG. 7 is a diagram illustrating isolation characteristics representing a ratio of output power with respect to input power of a signal to be output from a feeder line of the 5 GHz-band split ring resonator antenna when a signal is input from a feeder line of the 2.4 GHz-band split ring resonator antenna in the second exemplary embodiment.

FIG. 7 is a diagram illustrating isolation characteristics representing a ratio of output power with respect to input power of a signal to be output from the feeder line 4b of the 5 GHz-band SR resonator antenna 20 when a signal is input from the feeder line 4a of the 2.4 GHz-band SR resonator antenna 10 in the second exemplary embodiment.

Isolation characteristics are characteristics representing a degree of isolation of a signal between input and output ports different from each other. Specifically, in FIG. 3, the characteristics represent a ratio, in the unit of dB, of output power of the feeder line 4b with respect to input power of the feeder line 4a when a signal of a frequency, for instance, from 2 GHz to 6 GHz is input to the feeder line 4a while changing the frequency, and a signal of the frequency is output to the feeder line 4b.

In FIG. 7, the horizontal axis represents a frequency, and the vertical axis represents an isolation (a degree of isolation). The horizontal axis representing a frequency is such that the frequency is increased toward the right direction. The vertical axis representing an isolation is such that leakage of a signal of the frequency to the other SR resonator antenna is reduced toward the lower direction (namely, the signal is isolated).

Referring to FIG. 7, the ratio of output power with respect to input power of a signal input from the feeder line 4a of the 2.4 GHz-band SR resonator antenna 10, when the signal leaks to the 5 GHz-band SR resonator antenna 20 and is output from the feeder line 4b at a frequency in 5 GHz band, is about −11 dB as a largest value. In other words, a signal of a frequency in 5 GHz band that is input to the feeder line 4a is output from the feeder line 4b only with attenuation of about 11 dB.

The SR resonator antennas 10 and 20 have reversibility such that radiation characteristics in transmitting a radio wave become receiving characteristics in receiving a radio wave, as well as another antenna. Thus, the power of a signal of a frequency in 5 GHz band that is input to the feeder line 4b is output from the feeder line 4a only with attenuation of about 11 dB.

Therefore, the 2.4 GHz-band SR resonator antenna 10 also receives a signal of a frequency in 5 GHz band that is radiated from the 5 GHz-band SR resonator antenna 20, whereby a high-frequency receiving circuit of a wireless unit (not illustrated) of 2.4 GHz band is saturated. As a result, the wireless unit (not illustrated) of 2.4 GHz band is incapable of receiving a signal that should be received originally.

However, by setting the reflectance (a return loss value) at a frequency in 5 GHz band to zero with respect to the impedance characteristics of the 2.4 GHz-band SR resonator antenna 10 illustrated in FIG. 5B, the 2.4 GHz-band SR resonator antenna 10 is inoperative as an antenna for receiving a frequency in 5 GHz band.

As a result, the high-frequency receiving circuit of the wireless unit of 2.4 GHz band is not saturated by the signal of a frequency in 5 GHz band that is radiated from the 5 GHz-band SR resonator antenna 20 (in other words, the isolation characteristics are improved). Thus, the wireless unit of 2.4 GHz band is capable of receiving a signal that should be received originally by the wireless unit of 2.4 GHz band.

Next, an antenna designing method for improving the isolation characteristics is described.

Isolation characteristics of an electronic device including the aforementioned antenna device at a frequency in 5 GHz band depend on design of a high-frequency circuit including a filter circuit in each of the wireless units and the like.

It is assumed that it is necessary to secure e.g. 20 dB as the value of isolation characteristics representing a degree of isolation from the 2.4 GHz-band SR resonator antenna 10 to the 5 GHz-band SR resonator antenna 20. In that case, it is necessary to improve the value of isolation characteristics from the current value of about 11 dB further by 9 dB.

It is necessary to increase, for instance, the distance between the 2.4 GHz-band SR resonator antenna 10 and the 5 GHz-band SR resonator antenna 20 in order to improve the isolation characteristics by 9 dB, without adding a component such as a filter circuit to the high-frequency circuit of the wireless unit.

Figure 8:
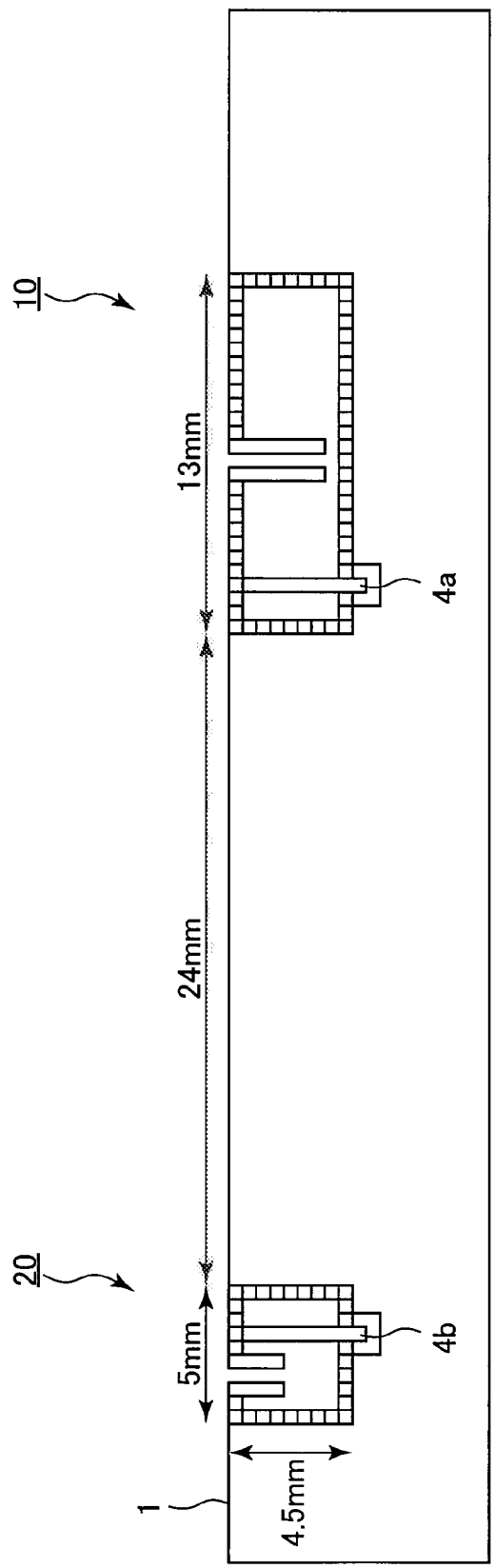
FIG. 8 is a diagram illustrating a distance between antennas, when the intensity of a signal of a frequency in 5 GHz band that is radiated from the 2.4 GHz-band split ring resonator antenna and that leaks to the 5 GHz-band split ring resonator antenna is reduced by increasing the distance between the 2.4 GHz-band split ring resonator antenna and the 5 GHz-band split ring resonator antenna according to the second exemplary embodiment.

As an example of a simulation result by a computer, as illustrated in FIG. 8 to be described later, it is necessary to secure a distance of e.g. 24 mm between antennas, which is further away 20 mm with respect to 4 mm illustrated in FIG. 3.

The aforementioned distance is a distance when a signal of a frequency in 5 GHz band which may leak from the 2.4 GHz-band SR resonator antenna 10 reaches the 5 GHz-band SR resonator antenna 20 by attenuation of 9 dB due to transmission loss.

FIG. 8 is a dimensional diagram of the shapes and the positions of antennas based on the simulation result.

FIG. 8 is a diagram illustrating a distance between antennas when the intensity of a signal of a frequency in 5 GHz band that is radiated from the 2.4 GHz-band SR resonator antenna 10 and leaks to the 5 GHz-band SR resonator antenna 20 is reduced by increasing the distance between the 2.4 GHz-band SR resonator antenna 10 and the 5 GHz-band SR resonator antenna 20 according to the second exemplary embodiment.

According to this configuration, the ratio of output power from the feeder line 4b with respect to input power of a signal of a frequency in 5 GHz band that is input from the feeder line 4a satisfies the target value of isolation characteristics i.e. 20 dB.

However, as illustrated in FIG. 8, when the distance between the antennas is increased, the size of the conductive substrate 1 on which the SR resonator antennas 10 and 20 are mounted may increase, which may increase the size of the entirety of the antenna device for housing the conductive substrate 1.

In the exemplary embodiment, the shape of the 5 GHz-band SR resonator antenna 20 remains unchanged, and the shape and the position of the 2.4 GHz-band SR resonator antenna 10 side are changed when a return loss value of the 2.4 GHz-band SR resonator antenna 10 at a frequency in 5 GHz band is improved.

Further, in the exemplary embodiment, even when the 2.4 GHz-band SR resonator antenna 10 and the 5 GHz-band SR resonator antenna 20 are disposed in proximity to each other, the shape and the position of the SR resonator antenna 10 are adjusted to satisfy the predetermined impedance characteristics and the predetermined reflection characteristics of each of the SR resonator antennas 10 and 20.

Figure 9:
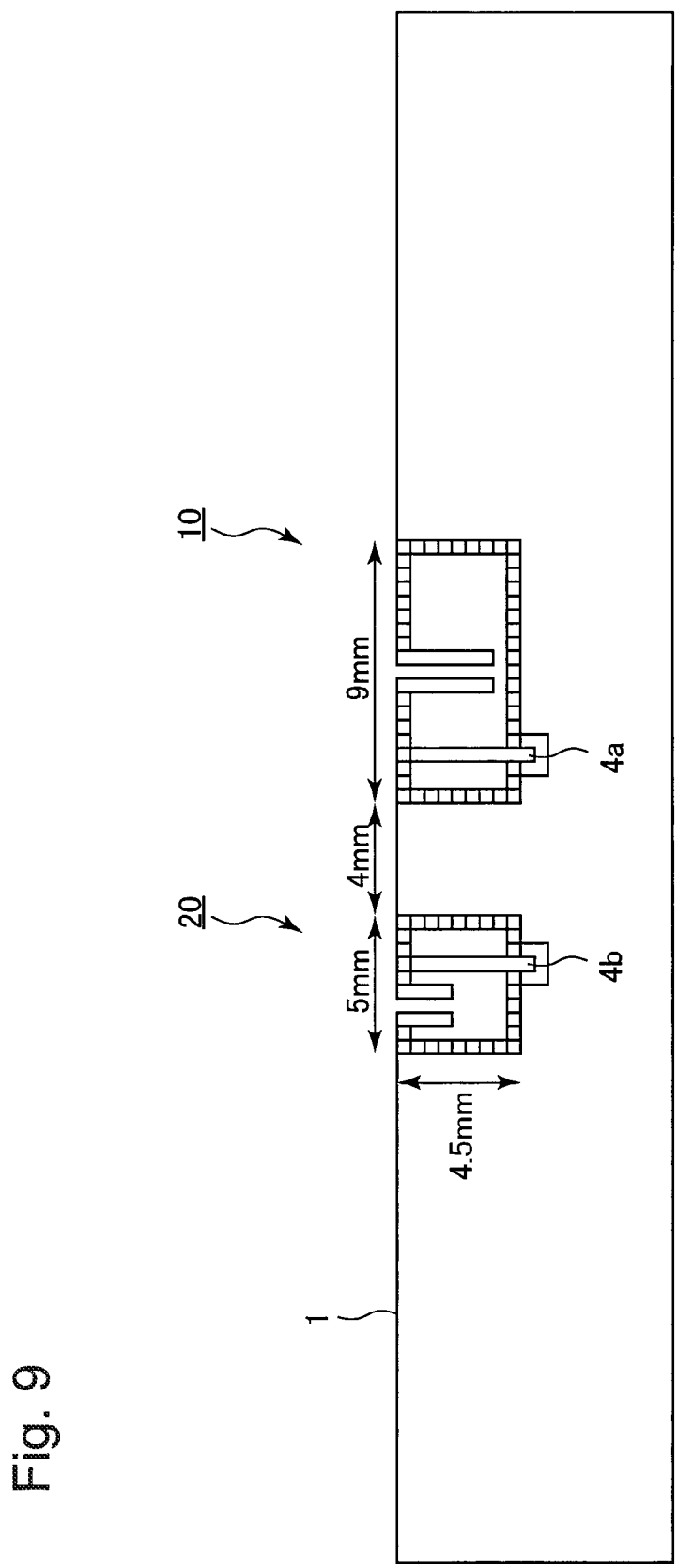
FIG. 9 is a diagram describing a state that the size of the 2.4 GHz-band split ring resonator antenna is reduced, leakage of a signal of a frequency in 5 GHz band is reduced, and the distance between the 2.4 GHz-band split ring resonator antenna and the 5 GHz-band split ring resonator antenna is shortened according to the second exemplary embodiment.

FIG. 9 is a dimensional diagram of a result when the shape and the position of the 2.4 GHz-band SR resonator antenna 10 are changed. Further, FIG. 10A and FIG. 10B illustrate impedance characteristics and reflection characteristics of the 2.4 GHz-band SR resonator antenna 10 in a state that the shape and the position of the 2.4 GHz-band SR resonator antenna 10 are changed.

FIG. 9 is a diagram, in which the size of the 2.4 GHz-band SR resonator antenna 10 is reduced by adjusting the line length of the 2.4 GHz-band SR resonator antenna 10 and the counter electrodes 7 sandwiching the split portion 5 according to the second exemplary embodiment. FIG. 9 is also a diagram describing a state that leakage of a signal of a frequency in 5 GHz band is reduced and the distance between the 2.4 GHz-band SR resonator antenna and the 5 GHz-band SR resonator antenna is shortened.

Figure 10A:
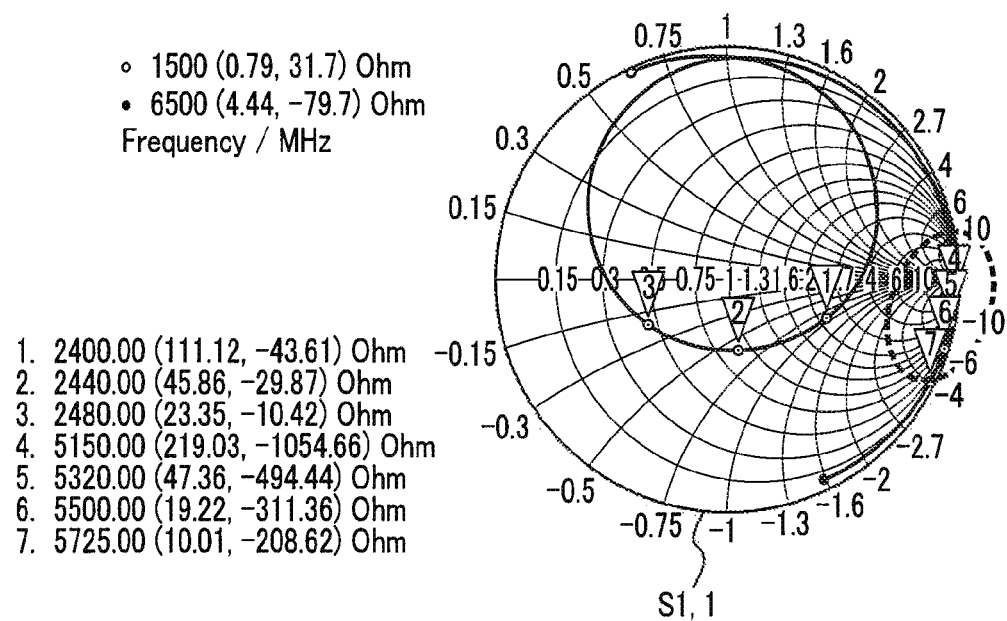
FIG. 10A is a diagram illustrating impedance characteristics of the 2.4 GHz-band split ring resonator antenna when the distance between the 2.4 GHz-band split ring resonator antenna and the 5 GHz-band split ring resonator antenna is shortened in the second exemplary embodiment.

FIG. 10A is a diagram illustrating impedance characteristics of the 2.4 GHz-band SR resonator antenna 10 when the size of the 2.4 GHz-band SR resonator antenna 10 is reduced by adjusting the line length of the 2.4 GHz-band SR resonator antenna 10 and the counter electrodes 7 sandwiching the split portion 5 according to the second exemplary embodiment. FIG. 10A is also a diagram illustrating impedance characteristics of the 2.4 GHz-band SR resonator antenna 10 when leakage of a signal of a frequency in 5 GHz band is reduced and the distance between the 2.4 GHz-band SR resonator antenna and the 5 GHz-band SR resonator antenna is shortened.

Figure 10B:
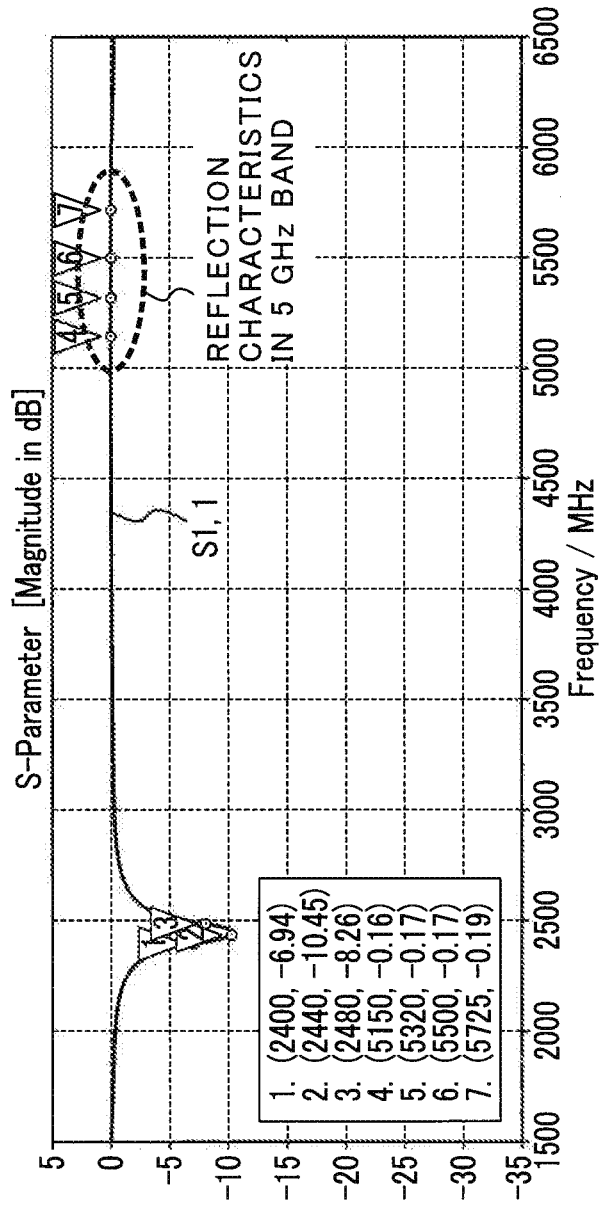
FIG. 10B is a diagram illustrating reflection characteristics of the 2.4 GHz-band split ring resonator antenna when the distance between the 2.4 GHz-band split ring resonator antenna and the 5 GHz-band split ring resonator antenna is shortened in the second exemplary embodiment.

FIG. 10B is a diagram illustrating reflection characteristics of the 2.4 GHz-band SR resonator antenna 10 when the size of the 2.4 GHz-band SR resonator antenna 10 is reduced by adjusting the line length of the 2.4 GHz-band SR resonator antenna 10 and the counter electrodes 7 sandwiching the split portion 5 according to the second exemplary embodiment. FIG. 10B is also a diagram illustrating reflection characteristics of the 2.4 GHz-band SR resonator antenna 10 when leakage of a signal of a frequency in 5 GHz band is reduced and the distance between the 2.4 GHz-band SR resonator antenna and the 5 GHz-band SR resonator antenna is shortened.

In the exemplary embodiment, the size of the 2.4 GHz-band SR resonator antenna 10 is reduced to such an extent that the ratio of reflection power with respect to input power, which represents reflection characteristics at a frequency in 5 GHz band is approximated to zero in the 2.4 GHz-band SR resonator antenna 10.

The method for shortening the line length of the 2.4 GHz-band SR resonator antenna 10 with respect to the opening 2a, and increasing the electrostatic capacitance between the counter electrodes 7 sandwiching the split portion 5 is performed based on Eq. 1 and Eq. 2, which are described in the first exemplary embodiment.

Specifically, the antenna device designing method according to the exemplary embodiment is based on the premise that there is reflection power with respect to input power at a frequency in 5 GHz band in the 2.4 GHz-band SR resonator antenna 10. In this case, the line length, which is the length of the conductive members surrounding the outer periphery of the opening 2a serving as the inductive reactance L component in the 2.4 GHz-band SR resonator antenna 10 is shortened.

According to the antenna device designing method of the exemplary embodiment, it is possible to increase the electrostatic capacitance (namely, the capacitive reactance C) between the counter electrodes 7 in the 2.4 GHz-band SR resonator antenna 10 by using Eq. 2, while continuing to use the resonance frequency f as the center frequency of 2.4 GHz band.

It is possible to increase the capacitive reactance C by the following methods using Eq. 1. Specifically, a) The total area S of the surfaces of the conductor layers 36 facing each other and constituting the counter electrodes 7 is increased by increasing the length of the counter electrodes 7 in the 2.4 GHz-band SR resonator antenna 10.

b) The gap distance d between the counter electrodes 7 is shortened.

c) The number of the conductor layers 36 constituting the counter electrodes 7 is increased.

Using one of the aforementioned methods a) to c), or combining at least two of the aforementioned methods a) to c) makes it possible to increase the capacitive reactance C.

It is also possible to adjust the capacitive reactance C by the thickness (height) of the conductor layer 36, in addition to the aforementioned parameters.

In this section, comparison is made between FIG. 5A and FIG. 5B illustrating antenna characteristics of the 2.4 GHz-band SR resonator antenna 10 before the size of the 2.4 GHz-band SR resonator antenna 10 is adjusted, and FIG. 10A and FIG. 10B illustrating antenna characteristics after the size of the 2.4 GHz-band SR resonator antenna 10 is adjusted. In this case, it is clear that a return loss value at a frequency in 5 GHz band is improved from about −7 dB to 0 dB in the antenna device designing method of the exemplary embodiment.

According to this configuration, a signal of a frequency in 5 GHz band that is input to the feeder line 4a of the 2.4 GHz-band SR resonator antenna 10 is reflected to the feeder line 4a. Therefore, the 2.4 GHz-band SR resonator antenna 10 is not operated as a 5 GHz-band SR resonator antenna (does not radiate a radio wave). This means that the signal does not leak to the feeder line 4b of the 5 GHz-band SR resonator antenna 20.

Conversely, a signal of a frequency in 5 GHz band that is input from the feeder line 4b of the 5 GHz-band SR resonator antenna 20 does not leak to the feeder line 4a of the 2.4 GHz-band SR resonator antenna 10.

As illustrated in FIG. 9, the 2.4 GHz-band SR resonator antenna 10 is configured such that the length of the side where the split portion 5a is formed, and the length of the side opposing to the aforementioned side are shortened from 13 mm illustrated in FIG. 3 to 9 mm illustrated in FIG. 9.

Figure 11:
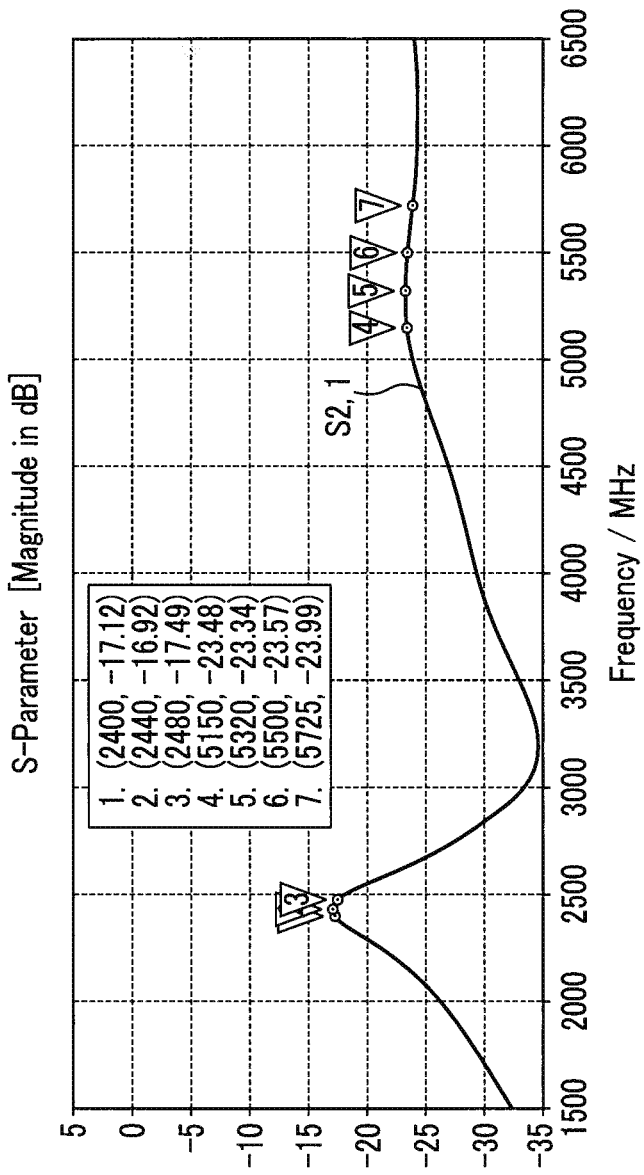
FIG. 11 is a diagram illustrating isolation characteristics representing a ratio of output power with respect to input power of a signal to be output from a feeder line of the 5 GHz-band split ring resonator antenna in the second exemplary embodiment.

FIG. 11 illustrates isolation characteristics of the SR resonator antennas 10 and 20 illustrated in FIG. 9.

FIG. 11 is a diagram illustrating isolation characteristics when leakage of a signal of a frequency in 5 GHz band is reduced by adjusting the line length of the 2.4 GHz-band SR resonator antenna 10 and the counter electrodes 7 sandwiching the split portion 5 according to the second exemplary embodiment. FIG. 11 is also a diagram illustrating isolation characteristics representing a ratio of output power with respect to input power of a signal output from the feeder line 4b of the 5 GHz-band SR resonator antenna 20 when a signal is input from the feeder line 4a of the 2.4 GHz-band SR resonator antenna 10 in shortening the distance between the 2.4 GHz-band SR resonator antenna and the 5 GHz-band SR resonator antenna.

Referring to FIG. 11, a return loss of the 2.4 GHz-band SR resonator antenna 10 is improved. Thus, as illustrated in FIG. 9, it is clear that it is possible to secure isolation characteristics even when the distance between the SR resonator antennas 10 and 20 is as small as 4 mm, as illustrated in FIG. 3. Specifically, in FIG. 11, a signal of a frequency in 5 GHz band from the 2.4 GHz-band SR resonator antenna 10 to the 5 GHz-band SR resonator antenna 20 is reduced by 20 dB or more.

The exemplary embodiment is advantageous in reducing leakage of a signal from the SR resonator antenna which resonates in a higher frequency band to the SR resonator antenna which resonates in a lower frequency band. This advantage is implementable without adding a component and the like, even when the split ring resonator antennas for different frequency bands are disposed in proximity to each other.

The reason is that reflection characteristics (a return loss value) of a higher frequency component of a lower frequency band antenna that is affected by a higher frequency band antenna, are adjusted to approximate to zero when the two split ring resonator antennas are disposed in proximity to each other.

Figure 12A:
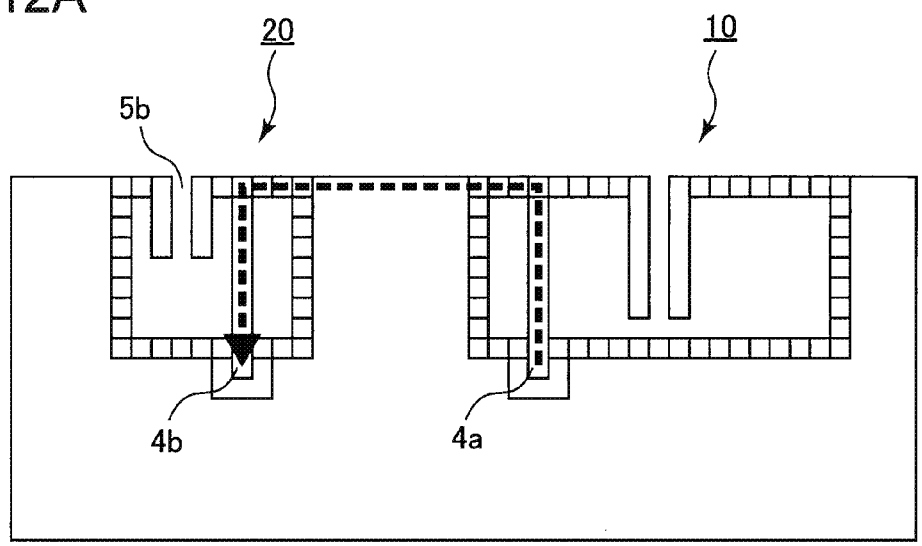
FIG. 12A is a diagram schematically illustrating a flow of high-frequency current i.e. a signal of a frequency in 2.4 GHz band, which leaks from a 2.4 GHz-band split ring resonator antenna before the positions of a split portion and a feeder line of a 5 GHz-band split ring resonator antenna are interchanged according to a third exemplary embodiment of the present invention.
Figure 12B:
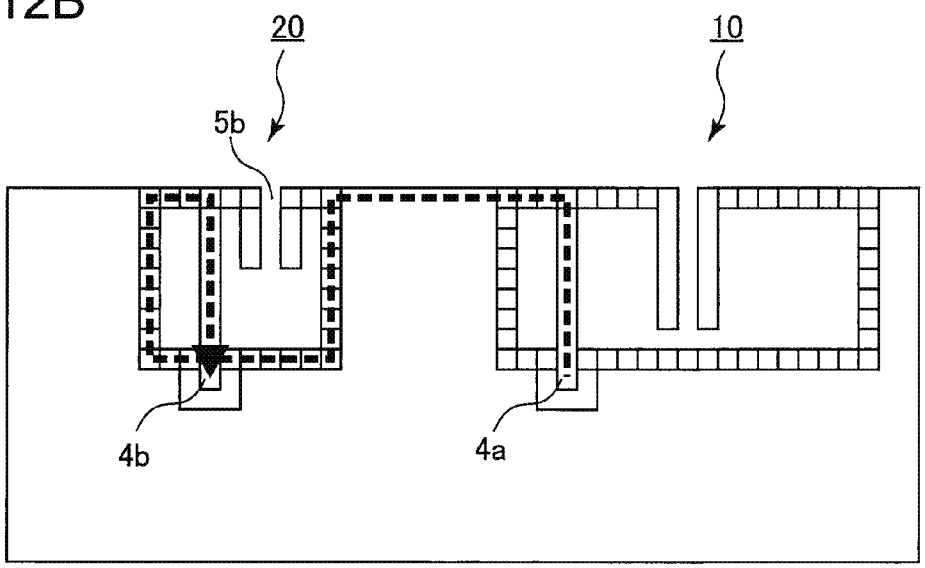
FIG. 12B is a diagram schematically illustrating a flow of high-frequency current i.e. a signal of a frequency in 2.4 GHz band, which leaks from the 2.4 GHz-band split ring resonator antenna after the positions of the split portion and the feeder line of the 5 GHz-band split ring resonator antenna are interchanged in the third exemplary embodiment of the invention.
Figure 13:
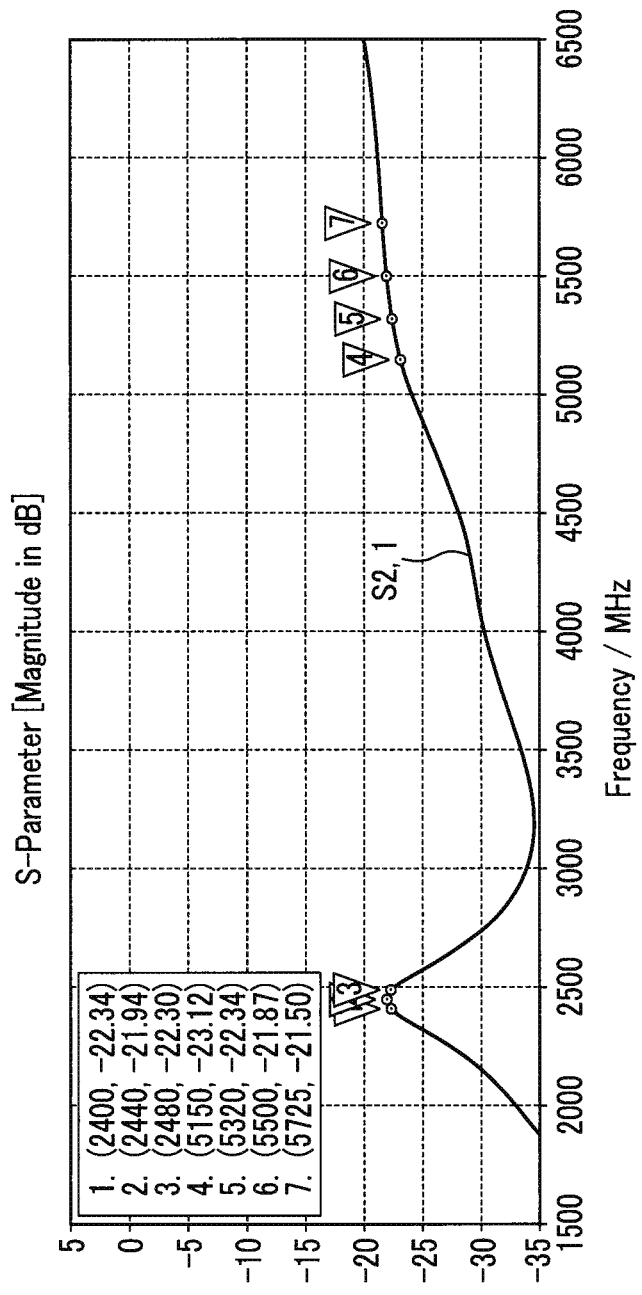
FIG. 13 is a diagram illustrating isolation characteristics representing a ratio of output power with respect to input power of a signal to be output from the feeder line of the 5 GHz-band split ring resonator antenna when a signal is input from a feeder line of the 2.4 GHz-band split ring resonator antenna after the positions of the split portion and the feeder line of the 5 GHz-band split ring resonator antenna are interchanged in the third exemplary embodiment.

Further, miniaturizing the lower frequency band antenna configuration, and shortening the distance between the lower frequency band antenna and the higher frequency band antenna is advantageous in miniaturizing an electronic device Third Exemplary Embodiment A third exemplary embodiment on the basis of the first and second exemplary embodiments is described using FIG. 12A, FIG. 12B, and FIG. 13.

The exemplary embodiment is different from the first and second exemplary embodiments in a point that the positions of the feeder line 4b and the split portion 5b of the 5 GHz-band SR resonator antennas 20 in the first and second exemplary embodiments are interchanged.

In the following, the features of the exemplary embodiment are mainly described. The same constituent elements in the exemplary embodiment as the constituent elements in the first and second exemplary embodiments are indicated with the same reference signs, and repeated description of the constituent elements is omitted.

In the diagram of FIG. 11 illustrating improved isolation characteristics of the 2.4 GHz-band SR resonator antenna 10 at a frequency in 5 GHz band according to the second exemplary embodiment, the isolation characteristics in 2.4 GHz band is about −17 dB. Therefore, in the example illustrated in FIG. 11, isolation characteristics are insufficient by about 3 dB with respect to the target isolation characteristics i.e. −20 dB.

In view of the above, in the exemplary embodiment, as illustrated in FIG. 12B, the positions of the feeder line 4b and the split portion 5b of the 5 GHz-band SR resonator antenna 20 are interchanged from the configuration illustrated in FIG. 9 (or FIG. 12A).

FIG. 12A is a diagram schematically illustrating a flow of high-frequency current i.e. a signal in 2.4 GHz band which may leak from the 2.4 GHz-band SR resonator antenna 10 before the positions of the split portion 5b and the feeder line 4b are interchanged in the 5 GHz-band SR resonator antenna 20 according to the third exemplary embodiment of the present invention.

FIG. 12B is a diagram schematically illustrating a flow of high-frequency current i.e. a signal in 2.4 GHz band which may leak from the 2.4 GHz-band SR resonator antenna 10 after the positions of the split portion 5b and the feeder line 4b are interchanged in the 5 GHz-band SR resonator antenna 20 according to the third exemplary embodiment. This is a configuration for improving isolation characteristics of the 2.4 GHz-band SR resonator antenna 10 for the 5 GHz-band SR resonator antenna in the exemplary embodiment.

FIG. 12A illustrates a case, in which the feeder line 4b of the 5 GHz-band SR resonator antenna 20 is near the position where the 2.4 GHz-band SR resonator antenna 10 is disposed. In this case, a signal of a frequency in 2.4 GHz band that is input from the feeder line 4a of the 2.4 GHz-band SR resonator antenna 10 slightly leak to the feeder line 4b of the 5 GHz-band SR resonator antenna along the route indicated by the dotted-line arrow.

This is because the impedance of the feeder line 4b of the 5 GHz-band SR resonator antenna 20 matches with a high-frequency circuit of an unillustrated wireless unit of 5 GHz band to be connected to the feeder line 4b, and high-frequency current flows from the 2.4 GHz-band SR resonator antenna 10 to the feeder line 4b.

As a result, the 5 GHz-band SR resonator antenna 20 also receives a signal of a frequency in 2.4 GHz band that is radiated from the 2.4 GHz-band SR resonator antenna 10, whereby the high-frequency receiving circuit of the wireless unit of 5 GHz band is saturated. As a result, the wireless unit of 5 GHz band in the 5 GHz-band is incapable of receiving a signal that should be received originally.

On the other hand, as illustrated in FIG. 12B, there is a case, in which the positions of the feeder line 4b and the split portion 5b are interchanged in such a manner that the split portion 5b of the 5 GHz-band SR resonator antenna 20 is disposed near the position where the 2.4 GHz-band SR resonator antenna 10 is disposed. In this case, even when a signal of a frequency in 2.4 GHz band that is input from the feeder line 4a of the 2.4 GHz-band SR resonator antenna 10 leaks to the 5 GHz-band SR resonator antenna 20, the signal bypasses the split portion 5b, and is supplied to the feeder line 4b, while being attenuated by the bypass route indicated by the dotted-line arrow.

Since the slit portion 5b is adjusted to resonate at a frequency in 5 GHz band, the electrostatic capacitance may be small for a signal of a frequency in 2.4 GHz band. When the slit portion 5b is observed from a signal of a frequency in 2.4 GHz band to be output from the 2.4 GHz-band SR resonator antenna 10, the slit portion 5b is considered in an open state. Therefore, it is difficult for the signal to pass through the slit portion 5b. On the other hand, it is easy for a signal of a frequency in 2.4 GHz band to pass through the bypass route, which is schematically illustrated by the dotted-line arrow in FIG. 12B, as compared with the slit portion 5b.

FIG. 13 illustrates isolation characteristics of the SR resonator antennas having the configuration as illustrated in FIG. 12B.

FIG. 13 is a diagram illustrating characteristics when the positions of the split portion 5b and the feeder line 4b of the 5 GHz-band SR resonator antenna 20 are interchanged in order to improve isolation characteristics of the 2.4 GHz-band SR resonator antenna 10 at a frequency in 2.4 GHz band according to the third exemplary embodiment. FIG. 13 is also a diagram illustrating isolation characteristics representing a ratio of output power with respect to input power of a signal to be output from the feeder line 4b of the 5 GHz-band SR resonator antenna 20 when a signal is input from the feeder line 4a of the 2.4 GHz-band SR resonator antenna 10 in the aforementioned case.

The following is a case, in which comparison is made between FIG. 11 illustrating isolation characteristics of the SR resonator antenna before the positions of the feeder line 4b and the split portion 5b of the 5 GHz-band SR resonator antenna 20 are interchanged described in the second exemplary embodiment referring to FIG. 9, and FIG. 13. In this case, isolation characteristics at a frequency in 2.4 GHz band are improved by about 5 dB from about −17 dB before improvement to about −22 dB after improvement. Thus, it is clear that 20 dB as a target value is satisfied.

The exemplary embodiment has a further advantage such that it is possible to reduce leakage of a signal from a lower frequency band SR resonator antenna to a higher frequency band SR resonator antenna.

This is because interchanging the positions of the feeder line 4b and the split portion 5b of a higher frequency antenna makes it possible to attenuate leakage of a signal from a lower frequency antenna by bypassing leakage of the signal from the lower frequency antenna.

As described above, the present invention has been described by way of the aforementioned exemplary embodiments as representative examples. The present invention, however, is not limited to the exemplary embodiments. More specifically, it is possible to apply various modifications comprehensible to a person skilled in the art within the scope of the present invention.

This application claims the priority based on Japanese Patent Application No. 2013-031233 filed on Feb. 20, 2013, and all of the disclosure of which is hereby incorporated.

REFERENCE SIGNS LIST

1 Conductive substrate
2, 2a, 2b Opening
3 Conductor via
4, 4a, 4b Feeder line
5, 5a, 5b Split portion
6, 6a, 6b Feeding point
7, 7a, 7b Counter electrodes
10 2.4 GHz-band SR resonator antenna
12a Split ring portion
20 5 GHz-band SR resonator antenna
31, 31a, 31b First split ring portion
32, 32a, 32b Second split ring portion
35 Dielectric layer
36 Conductor layer
36A First conductor layer
36B Second conductor layer
39 Clearance
51, 51a, 51b First split portion
52, 52a, 52b Second split portion

What is claimed is:

1. A method for designing an antenna device, the antenna device comprising:
a plurality of structures, each structure including:
a first split ring portion which is formed in a first conductor layer of a structural member configured such that a dielectric layer and a conductor layer are alternately laminated to each other, the first conductor layer extending on one surface side of the dielectric layer, the first split ring portion surrounding an opening, the first split ring portion including a first split portion formed in a part of a circumferential direction along the opening;
a second split ring portion which is formed in a second conductor layer extending on the other surface side of the dielectric layer, the second split ring portion surrounding an opening formed to face the first split ring portion, the second split ring portion including a second split portion formed in a part of a circumferential direction along the opening;
a plurality of conductor vias which are formed away from each other at an interval circumferentially while sandwiching the first split portion and the second split portion, and the plurality of conductor vias electrically connecting the first split ring portion and the second split ring portion; and
a feeder line which is formed on a specific one of the conductor layers, with one end of the feeder line electrically connected to at least one of the conductor vias, the other end of the feeder line insulated from the specific conductor layer by a clearance formed in the specific conductor layer along an extending direction of the specific conductor layer, wherein
a first one of the structures constitutes a first split ring resonator antenna which resonates at a first frequency, and
a second one of the structures constitutes a second split ring resonator antenna which resonates at a second frequency;
the antenna device further comprising:
counter electrodes which are formed at a right angle while extending from the respective conductor layers at both ends of the first split ring portion and the second split ring portion inward toward a position where the opening is formed in such a manner as to sandwich the first split portion and the second split portion included in each of the first split ring resonator antenna and the second split ring resonator antenna,
the method comprising:
adjusting the antenna device in such a manner that an electrostatic capacitance between the counter electrodes of the first split ring resonator antenna is increased, as a length of a side portion of the first split ring resonator antenna where the first split portion and the second split portion are formed, and a length of a side of the first split ring resonator antenna facing the side are shortened so as to approximate a value of reflectance representing a ratio of output power with respect to input power of a signal of a second frequency to be input to the first split ring resonator antenna to zero when the input signal of the second frequency is reflected on the first split ring resonator antenna.

2. The method for designing an antenna device according to claim 1, wherein
in accordance with shortening the length of the side portion of the first split ring resonator antenna where the first split portion and the second split portion are formed and shortening the length of the side portion facing the side portion, the electrostatic capacitance between the counter electrodes is increased by any one of
(i) increasing a length of the counter electrodes,
(ii) shortening a gap distance between the counter electrodes, and
(iii) increasing the number of the conductor layers constituting the counter electrodes;
or a combination of at least two of (i), (ii) and (iii).

3. The method for designing an antenna device according to claim 1, further comprising:
interchanging positions of the split portion and the feeder line of the second split ring resonator antenna for reducing a value of isolation characteristics representing a ratio of output power of a signal output from the feeder line of the second split ring resonator antenna with respect to input power of a signal input to the feeder line of the first split ring resonator antenna when the signal to be radiated from the first split ring resonator antenna leaks to the second split ring resonator antenna.

4. The method for designing an antenna device according to claim 1, wherein
the first frequency is a frequency in 2.4 GHz band, and the second frequency is a frequency in 5 GHz band.

* * * * *